(12) United States Patent
Lee et al.

(10) Patent No.: US 12,672,285 B2
(45) Date of Patent: Jun. 30, 2026

(54) SEMICONDUCTOR DEVICE AND ELECTRONIC SYSTEM INCLUDING THE SAME

(71) Applicant: Samsung Electronics Co., Ltd., Suwon-si (KR)

(72) Inventors: Soo Yong Lee, Suwon-si (KR); Jung Min Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 619 days.

(21) Appl. No.: 18/110,052

(22) Filed: Feb. 15, 2023

(65) Prior Publication Data

US 2023/0320097 A1 Oct. 5, 2023

(30) Foreign Application Priority Data

Apr. 1, 2022 (KR) ......................... 10-2022-0040869

(51) Int. Cl.
| | |
|---|---|
| *H10B 43/27* | (2023.01) |
| *G11C 16/04* | (2006.01) |
| *H10B 41/10* | (2023.01) |
| *H10B 41/27* | (2023.01) |
| *H10B 41/35* | (2023.01) |
| *H10B 41/40* | (2023.01) |

(Continued)

(52) U.S. Cl.
CPC ......... *H10B 43/27* (2023.02); *G11C 16/0483* (2013.01); *H10B 41/10* (2023.02); *H10B 41/27* (2023.02); *H10B 41/35* (2023.02);

*H10B 41/40* (2023.02); *H10B 43/10* (2023.02); *H10B 43/35* (2023.02); *H10B 43/40* (2023.02)

(58) Field of Classification Search
CPC ................................ H10B 43/27; H10B 43/20
See application file for complete search history.

(56) References Cited

U.S. PATENT DOCUMENTS

| | | | |
|---|---|---|---|
| 9,285,673 B2 | 3/2016 | Huang et al. | |
| 9,612,526 B2 | 4/2017 | Lin et al. | |

(Continued)

FOREIGN PATENT DOCUMENTS

| | | |
|---|---|---|
| KR | 10-2009-0096969 A | 9/2009 |
| KR | 10-2011-0002360 A | 1/2011 |
| KR | 10-2022-0042566 A | 4/2022 |

*Primary Examiner* — Christopher A Johnson
(74) *Attorney, Agent, or Firm* — Muir Patent Law, PLLC

(57) ABSTRACT

A semiconductor device includes a substrate extending in a first direction and a second direction perpendicular to the first direction, the substrate disposed on a peripheral circuit region and has a cell array region formed therein, a first mold structure which includes insulating layers and gate electrode layers alternately stacked on the substrate, first and second channel structures penetrating, in a third direction perpendicular to the first direction and the second direction, the first mold structure and spaced apart from each other in the first direction, a separation structure penetrating the first mold structure in the third direction between the first and second channel structures and separating the gate electrode layers in the first direction, and first and second auxiliary channel structures penetrating a part of the first mold structure between the separation structure and the first channel structure, and between the separation structure and the second channel structure.

20 Claims, 25 Drawing Sheets

(51) Int. Cl.
  H10B 43/10 (2023.01)
  H10B 43/35 (2023.01)
  H10B 43/40 (2023.01)

(56) References Cited

U.S. PATENT DOCUMENTS

| 9,871,051 | B2 | 1/2018 | Takahashi | |
| 10,627,722 | B2 | 4/2020 | Tel et al. | |
| 2021/0028186 | A1* | 1/2021 | Lim | H10D 64/685 |
| 2021/0399005 | A1* | 12/2021 | Lee | H01L 21/76805 |
| 2022/0068317 | A1* | 3/2022 | Fukuzumi | H10B 41/27 |
| 2022/0336484 | A1* | 10/2022 | Iwai | H10B 41/40 |

* cited by examiner

SEMICONDUCTOR DEVICE AND ELECTRONIC SYSTEM INCLUDING THE SAME

CROSS-REFERENCE TO RELATED APPLICATION

This application claims priority from Korean Patent Application No. 10-2022-0040869 filed on Apr. 1, 2022 in the Korean Intellectual Property Office, and all the benefits accruing therefrom under 35 U.S.C. 119, the contents of which in its entirety are herein incorporated by reference.

BACKGROUND

1. Technical Field

The present disclosure relates to a semiconductor device and an electronic system including the same, and more specifically, a three-dimensional semiconductor device having a vertical channel structure and improved electrical characteristics and a method for fabricating the same.

2. Description of the Related Art

A degree of integration of semiconductor devices increases to provide improved performance and cost efficiencies. In the case of a two-dimensional or planar semiconductor device, the degree of integration is determined by an area occupied by unit memory cells. Therefore, in recent years, three-dimensional semiconductor devices in which unit memory cells are placed vertically have been developed.

Further, in order to improve the degree of integration of semiconductor elements, the number of layers of word lines and the number of channel holes vertically stacked inside the semiconductor device are increasing. In this case, there is a problem that etch loading becomes non-uniform in an etching process of forming a hole for forming a word line separation structure for separating the word lines and a channel hole.

SUMMARY

Aspects of the present disclosure provide a semiconductor device capable of ensuring the reliability of components, while reducing the number of processes for forming patterns constituting the semiconductor device.

Aspects of the present disclosure also provide an electronic system capable of ensuring the reliability of components, while reducing the number of processes for forming patterns constituting the semiconductor device.

According to an embodiment of the present disclosure, there is provided a semiconductor device comprising a substrate extending in a first direction and a second direction perpendicular to the first direction, the substrate disposed on a peripheral circuit region and has a cell array region formed therein, a first mold structure which includes insulating layers and gate electrode layers alternately stacked on the substrate, first and second channel structures penetrating, in a third direction perpendicular to the first direction and the second direction, the first mold structure and spaced apart from each other in the first direction, a separation structure penetrating the first mold structure in the third direction between the first and second channel structures and separating the gate electrode layers in the first direction, and first and second auxiliary channel structures penetrating a part of the first mold structure in the third direction between the separation structure and the first channel structure, and between the separation structure and the second channel structure.

According to the aforementioned and other embodiments of the present disclosure, there is provided a semiconductor device comprising a substrate, extending in a first direction and a second direction perpendicular to the first direction, on which a plurality of cell regions, a separation region between the plurality of cell regions, and a dummy region between one of the plurality of cell regions and the separation region are formed, a mold structure which includes insulating layers and gate electrode layers alternately stacked on the substrate, first and second channel structures penetrating, in a third direction perpendicular to the first direction and the second direction, the mold structure and spaced apart from each other in the first direction, in each of the plurality of cell regions, a separation structure penetrating the mold structure in the third direction between the first and second channel structures, in the separation region, and first and second auxiliary channel structures which are spaced apart from each other in the second direction, in the dummy region, wherein each of the first channel structure and the separation structure is disposed between the first and second auxiliary channel structures on the basis of the second direction.

According to the aforementioned and other embodiments of the present disclosure, there is provided an electronic system comprising a main board, a semiconductor device on the main board, and a controller electrically connected to the semiconductor device on the main board, wherein the semiconductor device includes a substrate, extending in a first direction and a second direction perpendicular to the first direction, on which a plurality of cell regions spaced apart from each other in the first direction, a separation region disposed between the plurality of cell regions in the first direction, and a dummy region disposed between one of the plurality of cell regions and the separation region on the basis of the first direction are formed, a first mold structure which includes insulating layers and gate electrode layers alternately stacked on the substrate, first and second channel structures that penetrate, in a third direction perpendicular to the first direction and the second direction, the first mold structure and are spaced apart from each other in the second direction, in each of the plurality of cell regions, first and second separation structures which are disposed at the same position as the first and second channel structures on the basis of the second direction in the separation region, and are spaced apart from each other in the second direction, and first and second auxiliary channel structures which are spaced apart from each other in the second direction in the dummy region, wherein the first and second auxiliary channel structures penetrate an upper part of the first mold structure, and do not come into contact with a bottom surface of the first mold structure.

However, aspects of the present disclosure are not restricted to the one set forth herein. The above and other aspects of the present disclosure will become more apparent to one of ordinary skill in the art to which the present disclosure pertains by referencing the detailed description of the present disclosure given below.

BRIEF DESCRIPTION OF DRAWINGS

The above and other aspects and features of the present disclosure will become more apparent from the following detailed description taken in conjunction with the attached drawings, in which:

FIG. 24 is an exemplary perspective view for explaining the electronic system according to some embodiments;

DETAILED DESCRIPTION OF THE EMBODIMENTS

Hereinafter, in order to explain the present disclosure more specifically, the present disclosure will be described in more detail referring to the accompanying drawings according to some embodiments of the present disclosure.

Hereinafter, a semiconductor memory device according to an exemplary embodiment will be described referring to FIGS. 1 to 7.

Figure 1:
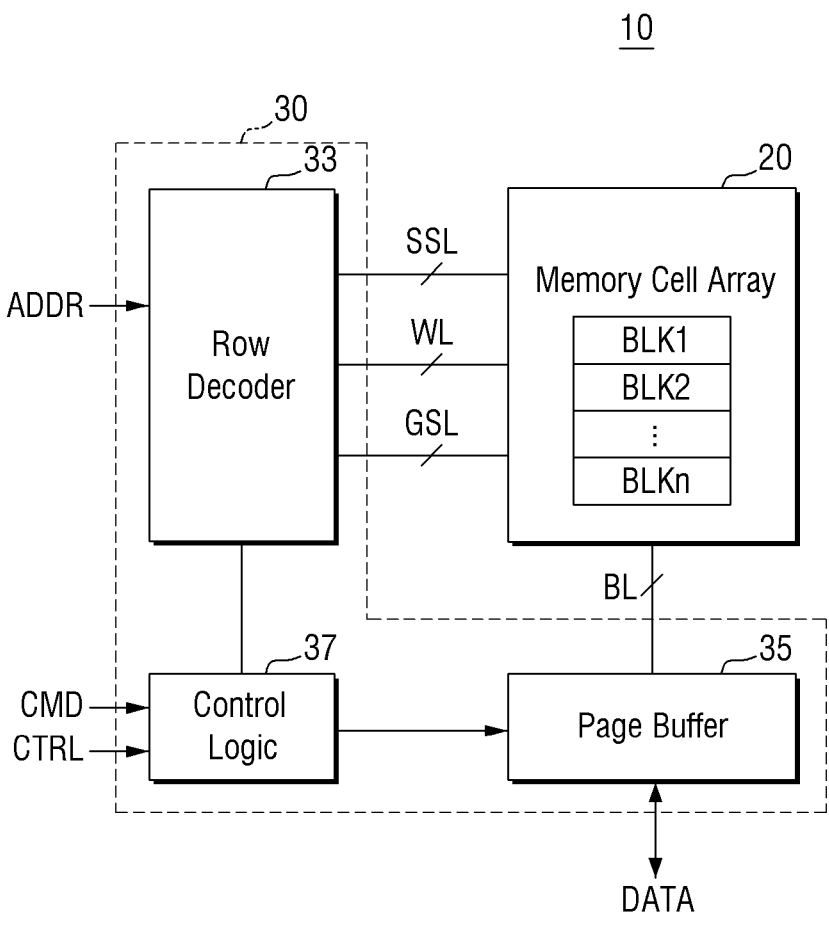
FIG. 1 is an exemplary block diagram for explaining a semiconductor memory device according to some embodiments.

FIG. 1 is an exemplary block diagram for explaining a semiconductor memory device according to some embodiments.

Referring to FIG. 1, a semiconductor memory device 10 according to some embodiments includes a memory cell array 20 and a peripheral circuit 30.

The memory cell array 20 may include a plurality of memory cell blocks BLK1 to BLKn. Each of the memory cell blocks BLK1 to BLKn may include a plurality of memory cells. The memory cell array 20 may be connected to the peripheral circuit 30 through a bit line BL, a word line WL, at least one string selection line SSL, and at least one ground selection line GSL. Specifically, the memory cell blocks BLK1 to BLKn may be connected to a row decoder 33 through the word line WL, the string selection line SSL, and the ground selection line GSL. Further, the memory cell blocks BLK1 to BLKn may be connected to a page buffer 35 through the bit line BL. Although not specifically shown, one memory cell block may be defined by two adjacent word line cutting structures. A plurality of channel structures CH, which will be described later, may be placed inside each memory cell block defined by the word line cutting structures.

The peripheral circuit 30 may receive an address ADDR, a command CMD, and a control signal CTRL from the outside of the semiconductor memory device 10, and may transmit and receive data DATA to and from an external device of the semiconductor memory device 10. The peripheral circuit 30 may include a control logic 37, a row decoder 33, and a page buffer 35. Although not shown, the peripheral circuit 30 may further include various sub-circuits such as an I/O circuit, a voltage generation circuit that generates various voltages necessary for the operation of the semiconductor memory device 10, and an error correction circuit for correcting an error of the data DATA that is read from the memory cell array 20.

The control logic 37 may be connected to the row decoder 33, the I/O circuit, and the voltage generation circuit. The control logic 37 may control the overall operation of the semiconductor memory device 10. The control logic 37 may generate various internal control signals used inside the semiconductor memory device 10 in response to the control signal CTRL. For example, the control logic 37 may adjust the voltage levels provided to the word lines WL and the bit lines BL, when performing a memory operation such as a program operation or an erase operation.

The row decoder 33 may select at least one of the plurality of memory cell blocks BLK1 to BLKn in response to the address ADDR, and may select at least one word line WL, at least one string selection line SSL, and at least one ground selection line GSL of the selected memory cell blocks BLK1 to BLKn. The row decoder 33 may transfer a voltage for performing the memory operation to the word line WL of the selected memory cell blocks BLK1 to BLKn.

The page buffer 35 may be connected to the memory cell array 20 through the bit lines BL. The page buffer 35 may operate as a writer driver or a sense amplifier. Specifically, when performing the program operation, the page buffer 35 may operate as the writer driver to apply a voltage according to the data DATA to be stored in the memory cell array 20 to the bit line BL. On the other hand, when performing the read operation, the page buffer 35 may operate as a sense amplifier to sense the data DATA stored in the memory cell array 20.

Figure 2:
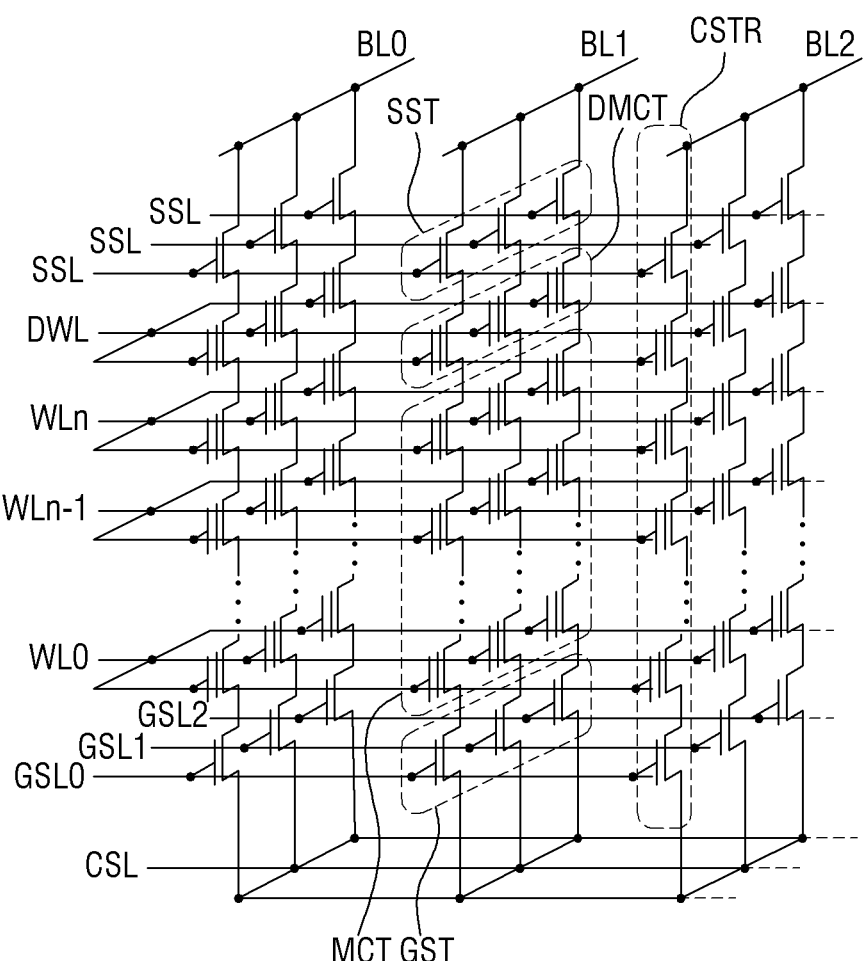
FIG. 2 is an exemplary circuit diagram of a semiconductor memory device according to some embodiments.

FIG. 2 is an exemplary circuit diagram of a semiconductor memory device according to some embodiments.

Referring to FIG. 2, a memory cell array of the semiconductor device according to some embodiments may include a common source line CSL, a plurality of bit lines BL0, BL1 and BL2, and a plurality of cell strings CSTR placed between the common source line CSL and the bit lines BL0, BL1 and BL2.

A plurality of cell strings CSTR may be connected in parallel to each of the bit lines BL0, BL1 and BL2. The plurality of cell strings CSTR may be commonly connected to the common source line CSL. That is, the plurality of cell strings CSTR may be placed between the plurality of bit lines BL0, BL1 and BL2 and one common source line CSL.

A plurality of common source lines CSL may be arranged two-dimensionally. Here, the same voltage may be electrically applied to the common source lines CSL, or each of the common source lines CSL may be electrically controlled.

For example, each cell string CSTR may be made up of a string selection transistor SST, memory cells MCT connected in series, and a ground selection transistor GST. Further, each of the memory cells MCT includes a data storage element.

As an example, each cell string CSTR may include a string selection transistor SST connected in series with the bit lines BL0 to BL2. The ground selection transistor GST may be connected to the common source line CSL. The memory cells MCT may be connected in series between the string selection transistor SST and the ground selection transistor GST.

Furthermore, each cell string CSTR may further include a dummy cell DMCT connected between the string selection transistor SST and the memory cell MCT.

Although not shown in the drawing, the dummy cell DMCT may also be connected between the ground selection transistor GST and the memory cell MCT. As another example, the ground selection transistor GST in each cell string CSTR may include a plurality of MOS transistors connected in series. As another example, each cell string CSTR may further include an erasure control transistor placed between the bit lines BL0 to BL2 and the string selection transistor SST. The erasure control transistor may be connected in series with the string selection transistor SST.

According to some embodiments, the string selection transistor SST may be controlled by the string selection line SSL. The memory cells MCT may be controlled by a plurality of word lines WL0 to WLn, and the dummy cells DMCT may be controlled by a dummy word line DWL. Further, the ground selection transistor GST may be controlled by the ground selection line GSL. The common source line CSL may be commonly connected to the sources of the ground selection transistor GST.

One cell string CSTR may be made of a plurality of memory cells MCT having different distances from the common source line CSL. Further, a plurality of word lines WL0 to WLn and DWL may be placed between the common source lines CSL and the bit lines BL0 to BL2.

The gate electrodes of the memory cells MCT placed at substantially the same distance from the common source line CSL may be commonly connected to one of the word lines WL0 to WLn and DWL and may be in an equipotential status. In contrast, even if the gate electrodes of the memory cells MCT are placed at substantially the same level from the common source lines CSL, the gate electrodes placed in different rows or columns may be controlled independently.

The ground selection lines GSL0 to GSL2 and the string selection lines SSL may extend in the same direction as, for example, the word lines WL0 to WLn, DWL. The ground selection lines GSL0 to GSL2 and the string selection lines SSL located at substantially the same level from the common source lines SSL may be electrically separated from each other.

Although not shown in the drawing, when the cell string CSTR includes erasure control transistors, the erasure control transistors may be controlled by a common erasure control line. The erasure control transistors generate a gate induced drain leak (GIDL) at the time of the erasing operation of the memory cell array. That is, the erasure control transistors ET may be GIDL transistors.

Figure 3:
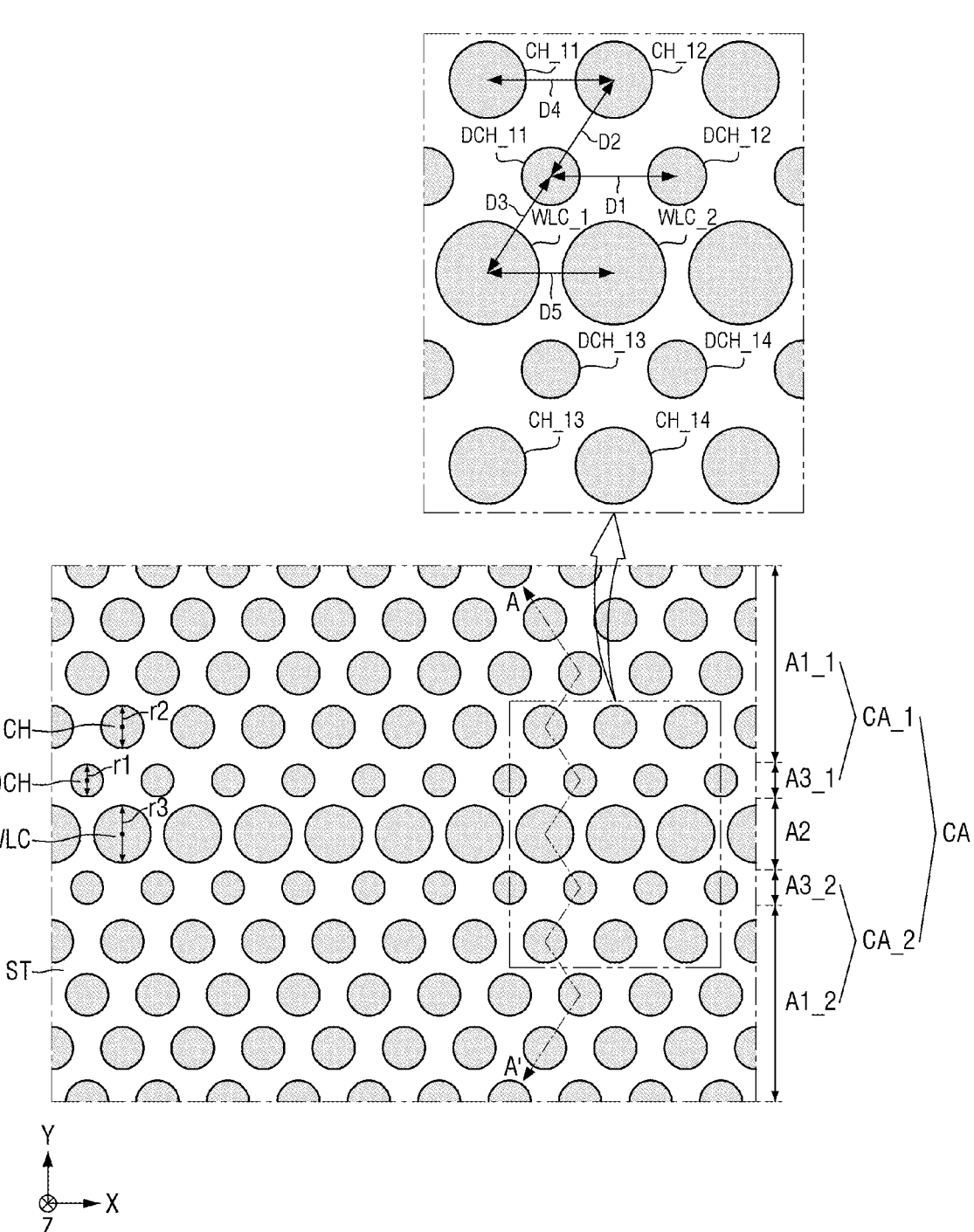
FIG. 3 is a schematic layout diagram for explaining a semiconductor device according to some embodiments.
Figure 4:
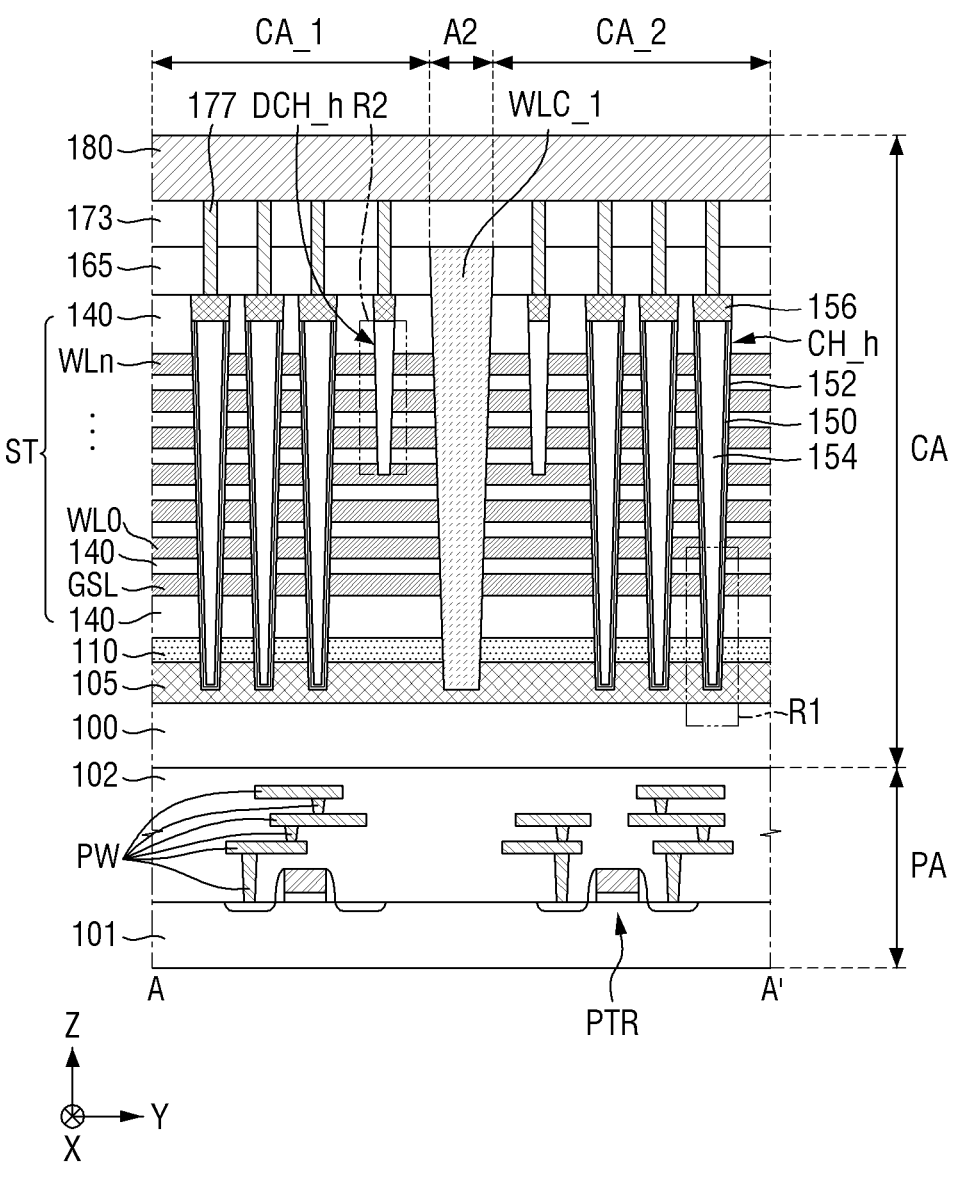
FIG. 4 is a diagram schematically showing a cross-sectional view taken along a line A-A' of FIG. 3.
Figure 5:
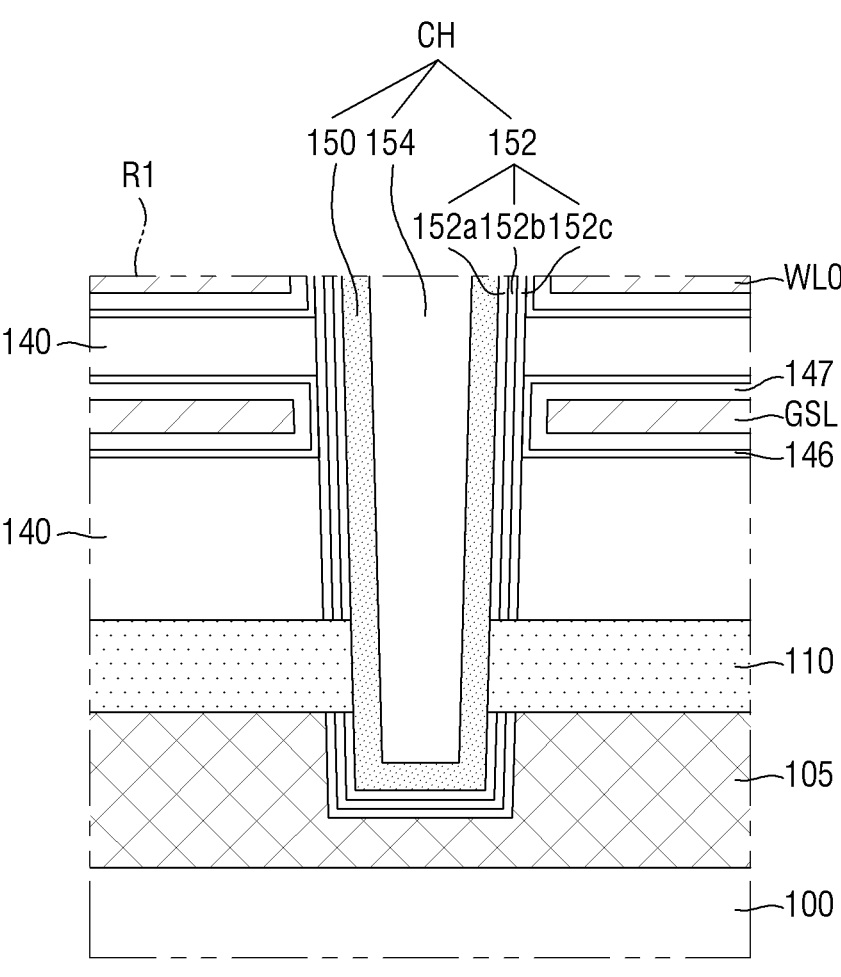
FIG. 5 is an enlarged view of R1 of FIG. 4.
Figure 6:
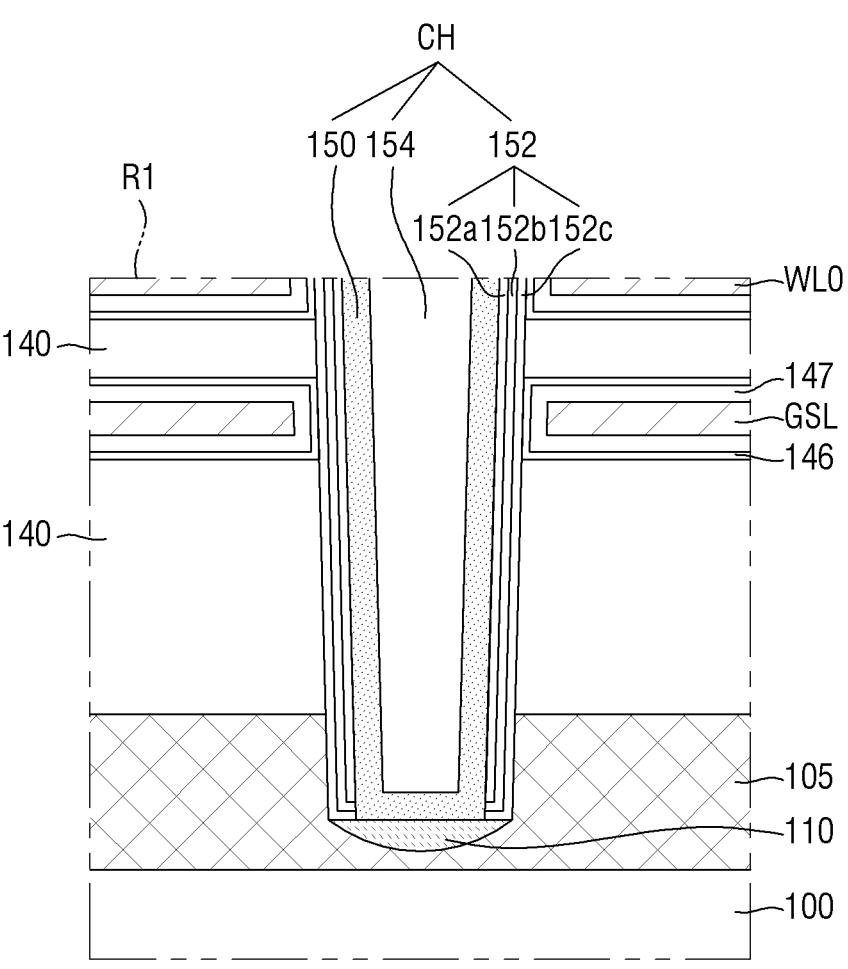
FIG. 6 is a diagram for explaining the semiconductor device according to some embodiments, and corresponding to the enlarged view of R1 of FIG. 5.
Figure 7:
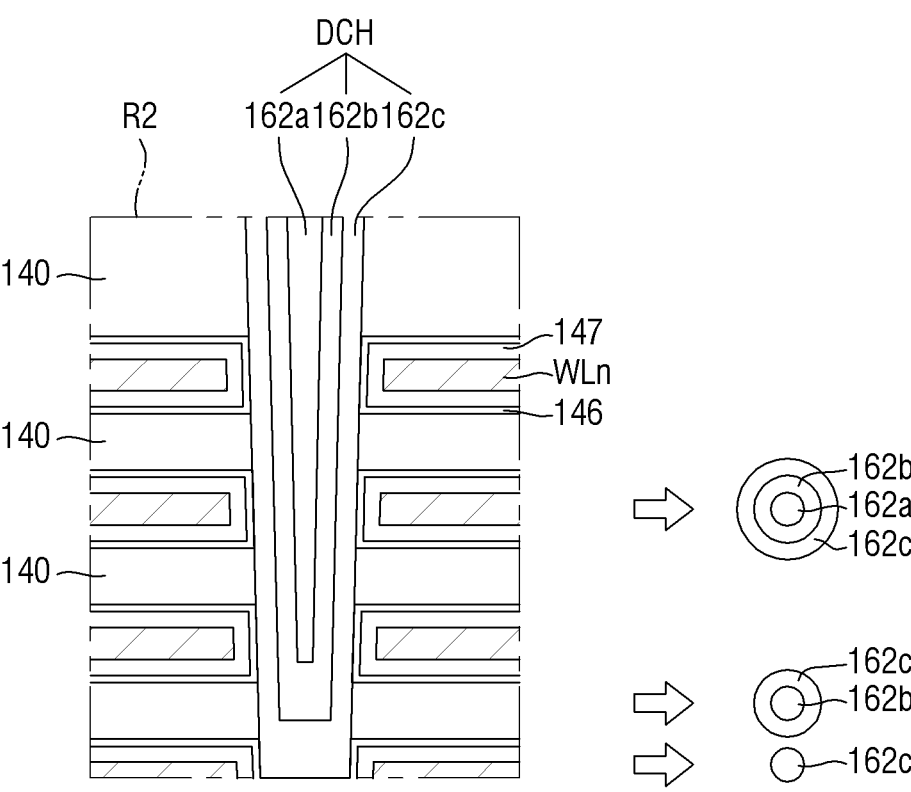
FIG. 7 is an enlarged view of R2 of FIG. 4.

FIG. 3 is a schematic layout diagram for explaining a semiconductor device according to some embodiments. FIG. 4 is a diagram schematically showing a cross-sectional view taken along a line A-A' of FIG. 3. FIG. 5 is an enlarged view of region R1 of FIG. 4. FIG. 6 is a diagram for explaining the semiconductor device according to some embodiments, and corresponding to the enlarged view of region R1 of FIG. 5. FIG. 7 is an enlarged view of region R2 of FIG. 4.

Referring to FIGS. 3 to 7, the semiconductor device according to some embodiments includes a first substrate 101, a second substrate 100, a mold structure ST, a channel structure CH, a separation structure WLC, and an auxiliary channel structure DCH. FIG. 3 is a diagram showing the uppermost surfaces of each of the channel structure CH, the separation structure WLC, and the auxiliary channel structure DCH that are in contact with the mold structure ST of FIG. 4. It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present at the point of contact.

According to some embodiments, the semiconductor device may include a cell array region CA and a peripheral circuit region PA.

The peripheral circuit region PA may include a peripheral circuit element PTR, a lower connection wiring body PW, and a peripheral logic insulating film 102.

The peripheral circuit element PTR may be formed on the first substrate 101. The peripheral circuit element PTR may be circuits that operate the structures of the cell array region CA.

The peripheral logic insulating film 102 may be formed on the first substrate 101. The peripheral logic insulating film 102 may include, for example, at least one of silicon oxide, silicon nitride, silicon oxynotride, and a low dielectric constant material.

The lower connection wiring body PW may be formed inside the peripheral logic insulating film 102. The lower connection wiring body PW may be connected to the peripheral circuit element PTR.

The cell array region CA may be placed on the peripheral circuit region PA. The cell array region CA may include a second substrate 100, a common source plate 105, a support semiconductor layer 110, a mold structure ST, a channel structure CH, and a bit line BL.

The second substrate 100 may be bulk silicon or silicon-on-insulator (SOI). In contrast, the second substrate 100 may be a silicon substrate or may include other materials, for example, but are not limited to, silicon germanium, silicon germanium on insulator (SGOI), indium antimonide, lead tellurium compounds, indium arsenic, indium phosphate, gallium arsenide or gallium antimonide.

The common source plate 105 may be placed on the second substrate 100. The common source plate 105 may serve as the common source line CSL of FIG. 2.

The common source plate 105 may include at least one of a conductive semiconductor film, a metal silicide film, and a metal film. When the common source plate 105 includes a conductive semiconductor film, the common source plate 105 may include, for example, at least one of silicon (Si), germanium (Ge), silicon germanium (SiGe), gallium arsenide (GaAs), indium gallium arsenide (InGaAs), aluminum gallium arsenide (AlGaAs), or a combination thereof.

The common source plate 105 may have a crystal structure including at least one selected from single crystal, amorphous and polycrystal. The common source plate 105 may include at least one of p-type impurities, n-type impurities and carbon included in the semiconductor film.

The support semiconductor layer 110 may be placed on the common source plate 105. The support semiconductor layer 110 may include, for example, but is not limited to, polysilicon. The support semiconductor layer 110 may include a semiconductor material such as, for example, silicon (Si), germanium (Ge) or a mixture thereof.

The cell array region CA may include the mold structure ST. The mold structure ST may be placed on the common source plate 105.

A plurality of conductive lines may include a ground selection line GSL, a plurality of word lines WL0 to WLn, a dummy word line DWL, at least one string selection line SSL, and at least one erasure control line MCL. The ground selection line GSL, the plurality of word lines WL0 to WLn, the dummy word line DWL, the string selection line SSL, and the erasure control line MCL may be sequentially stacked on the second substrate 100.

Referring to FIG. 4, although only six word lines WL0 to WLn are shown on the ground selection line GSL, this is only for convenience of explanation, and the embodiment is not limited thereto.

Referring to FIG. 4, the mold structure ST may include the ground selection line GSL and some word lines WL0 to WLn.

In some embodiments, the mold structure ST may be placed on the support semiconductor layer 110. The mold structure ST may include a plurality of gate electrode layers and a plurality of inter-electrode insulating layers 140 which are alternately stacked on the support semiconductor layer 110. For example, each of the gate electrode layers and each inter-electrode insulating layer 140 may have a layered structure extending in a first direction Y and a second direction X that is perpendicular to the first direction Y. The gate electrode and the inter-electrode insulating layer 140 may be alternately stacked in a third direction Z that intersects (for example, perpendicular to) the first direction X and the second direction Y, and the upper surface of the second substrate 100.

In some embodiments, the plurality of gate selection lines GSL and word lines WL0 to WLn may be formed from the gate electrode layers alternately stacked with the inter-electrode insulating layer 140 on the second substrate 100. For example, in some embodiments, the ground selection line GSL may be a gate electrode placed at the bottom of the plurality of gate electrode layers.

The gate electrode layer may include or may be formed of one of doped semiconductor materials (doped silicon, doped germanium, etc.), conductive metal nitrides (titanium nitride, tantalum nitride, etc.), metals (tungsten, titanium, tantalum, nickel, etc.), and metal-semiconductor compounds (tungsten silicide, cobalt silicide, titanium silicide, etc.). An etching process may be performed such that the gate electrode layer is etched to form the gate selection line GSL and word lines WL0 to WLn In some embodiments, although the gate selection line GSL and WL0 to WLn are shown to be formed of a single layer, this is only for convenience of explanation, and the embodiment is not limited thereto.

Referring to FIG. 5, an insulating film 146 may be placed between an information storage pattern 152 and the gate selection line GSL and word lines WL0 to. The insulating film 146 may include, for example, silicon oxide or a high dielectric constant material (for example, aluminum oxide ($Al_2O_3$), and hafnium oxide ($HfO_2$)). Unlike that shown, the insulating film 146 may not be placed between the information storage pattern 152 and the gate selection line GSL and word lines WL0 to WLn.

The gate selection line GSL and word lines WL0 to WLn may further include a barrier conductive film 147. The barrier conductive film 147 may include at least one of a metal, a metal nitride, a metal carbonitride, and a two-dimensional (2D) material. For example, the two-dimensional material may be a metallic material and/or a semiconductor material. The two-dimensional material (2D material) may include a two-dimensional allotrope or a two-dimensional compound.

The inter-electrode insulating layer 140 may include an insulating material. For example, the inter-electrode insulating layer 140 may include, but is not limited to, silicon oxide.

The channel structure CH may penetrate the mold structure ST. Further, the plurality of channel structures CH may extend in a direction intersecting the plurality of gate selection lines GSL and word lines WL0 to WLn. For example, each channel structure CH may extend in the third direction Z.

A width of a lower surface of the channel structure CH in the first direction Y may be smaller than a width of an upper surface of the channel structure CH in the first direction Y. The width of the channel structure CH in the first direction Y may increase, as it extends away from the upper surface of the second substrate 100. This may be due to the characteristics of the etching process for forming the channel structure CH. However, the technical aspects of the present disclosure are not limited thereto.

The channel structure CH may include a semiconductor pattern 150 and an information storage pattern 152.

The semiconductor pattern 150 may penetrate the mold structure ST. For example, the semiconductor pattern 150 may extend in the third direction Z. The semiconductor pattern 150 may include, but is not limited to, semiconductor materials such as, for example, single crystal silicon, polycrystalline silicon, organic semiconductor matters, and carbon nanostructures.

The information storage pattern 152 may be interposed between the semiconductor pattern 150 and each of the gate electrode layers GSL and WL0 to WLn. For example, the information storage pattern 152 may extend along the side surfaces of the semiconductor pattern 150.

The information storage pattern 152 may include, for example, at least one of silicon oxide, silicon nitride, silicon oxynitride, and high dielectric constant material having a higher dielectric constant than silicon oxide. The high dielectric constant material may include, for example, at least one of aluminum oxide, hafnium oxide, lanthanum oxide, tantalum oxide, titanium oxide, lanthanum hafnium oxide, lanthanum aluminum oxide, dysprosium scandium oxide, and combinations thereof.

In some embodiments, the information storage pattern 152 may include multiple films. For example, referring to FIGS. 4 and 5, the information storage pattern 152 of the channel structure CH may include a tunnel insulating film 152a, a charge storage film 152b, and a blocking insulating film 152c formed along a profile of a channel hole CH_h penetrating the mold structure ST.

The tunnel insulating film 152a may include, for example, silicon oxide or a high dielectric constant material having a higher dielectric constant than silicon oxide (for example, aluminum oxide ($Al_2O_3$), and hafnium oxide ($HfO_2$)). The charge storage film 152b may include, for example, silicon nitride. The blocking insulating film 152c may include, for example, silicon oxide or a high dielectric constant material having a higher dielectric constant than silicon oxide (for example, aluminum oxide ($Al_2O_3$), and hafnium oxide ($HfO_2$)).

Referring to FIG. 5, the tunnel insulating film 152a, the charge storage film 152b, and the blocking insulating film 152c may be separated from a lower part of the channel structure CH. The support semiconductor layer 110 may be placed between the separated tunnel insulating film 152a, the charge storage film 152b, and the blocking insulating film 152c. The support semiconductor layer 110 may contact the semiconductor pattern 150 and may electrically connect the common source plate 105 and the semiconductor pattern 150.

Alternatively, referring to FIG. 6, the support semiconductor layer 110 may not be placed between the separated tunnel insulating film 152a, the charge storage film 152b, and the blocking insulating film 152c. Instead, the support semiconductor layer 110 may be disposed below the channel structure CH and in contact with a bottom surface of the semiconductor pattern 150. In this instance, as illustrated in FIG. 6, the tunnel insulating film 152a, the charge storage film 152b, and the blocking insulating film 152c may cover side surfaces of the semiconductor pattern 150 and may be separated from (i.e., not cover) the bottom surface of the semiconductor pattern 150. The semiconductor pattern 150 may be electrically connected to the common source plate 105 through the bottom surface of the exposed semiconductor pattern 150.

In some embodiments, the channel structure CH may further include a filling pattern 154. The filling pattern 154 may be formed to fill the inside of the semiconductor pattern 150. For example, the semiconductor pattern 150 may extend along the side surfaces and bottom surface of the filling pattern 154. The filling pattern 154 may include, but is not limited to, for example, silicon oxide.

In some embodiments, the channel structure CH may further include a channel pad 156. The channel pad 156 may be formed to be connected to the upper part of the semiconductor pattern 150. For example, the channel pad 156 may be formed inside the inter-electrode insulating layer 140 placed at the uppermost part of the mold structure ST.

Although the channel pad 156 is shown to be formed on the upper surface of the semiconductor pattern 150 in FIG. 4, this is merely an example. For example, the upper portion of the semiconductor pattern 150 may be formed to extend along the side surface of the channel pad 156. The channel pad 156 may include, for example, but is not limited to, polysilicon doped with impurity.

Referring to FIGS. 3 and 4, first and second cell regions A1_1 and A1_2, a separation region A2 between the first and second cell regions A1_1 and A1_2, a first dummy region A3_1 between the first cell region A1_1 and the separation region A2, and a second dummy region A3_2 between the second cell region A1_2 and the separation region A2 may be formed on the second substrate 100.

The channel structure CH may include first and second channel patterns CH_11 and CH_12 and third and fourth channel patterns CH_13 and CH_14 that penetrate the mold structure ST and are spaced apart from each other in the second direction X. Further, the channel structure CH may include first and third channel patterns CH_11 and CH_13 and second and fourth channel patterns CH_12 and CH_14 that are spaced apart from each other in the first direction Y. The first and second channel patterns CH_11 and CH_12 are formed in the first cell array region CA_1, and the third and fourth channel patterns CH_13 and CH_14 may be formed in the second cell array region CA_2.

In some embodiments, the first channel structure CH_1 may be arranged in the form of zigzag. For example, as shown in FIG. 3, a plurality of channel structures CH may be arranged alternately in the first direction Y and the second direction X. The plurality of channel structures CH arranged in the form of zigzag may further improve the degree of integration of the non-volatile memory device.

A first interlayer insulating film 165 and a second inter-layer insulating film 173 may be disposed on top of the inter-electrode insulating layer 140. The first interlayer insulating film 165 and the second interlayer insulating film 173 may include, for example, but are not limited thereto, silicon oxide.

A plurality of bit lines 180 may be disposed on top of the second interlayer insulating film 173. The plurality of bit lines 180 may extend side by side in the first direction Y to be spaced apart from each other.

Each bit line 180 may be connected to a plurality of channel structures CH. For example, as shown in FIG. 4, the bit line 180 may be connected to a plurality of channel structures CH through a bit line contact 177. The bit line contact 177 may penetrate, for example, the first interlayer insulating film 165 and the second interlayer insulating film 173 to electrically connect the bit line 180 and the channel structure CH.

The mold structure ST may be separated by the separation structure WLC. The separation structure WLC may extend in a direction intersecting the bit line 180. For example, the separation structure WLC may extend in the third direction Z to completely cut the mold structure ST.

Therefore, a plurality of gate selection lines GSL and word lines WL0 to WLn may be cut by the separation structure WLC. The separation structure WLC may separate the cell array region CA of the mold structure ST.

Referring to FIG. 3, the separation structure WLC may include first and second separation patterns WLC_1 and WLC_2 that are spaced apart from each other in the second direction X in the separation region A2 between the first and second cell array regions CA_1 and CA_2.

An auxiliary channel structure DCH may be placed in a dummy region A3 between the separation structure WLC and the channel structure CH. Specifically, the auxiliary channel structure DCH may include a first auxiliary channel pattern DCH_11 placed in the first dummy region A3_1 between the first channel pattern CH_11 and the first separation pattern WLC_1, and a second auxiliary channel pattern DCH_12 that is spaced apart from the first auxiliary channel pattern DCH_11 in the second direction X and is placed in the first dummy region A3_1 between the second channel pattern CH_12 and the second separation pattern WLC_2.

Further, the auxiliary channel structure DCH may include a third auxiliary channel pattern DCH_13 placed in a second dummy region A3_2 between the third channel pattern CH_13 and the first separation pattern WLC_1, and a fourth auxiliary channel pattern DCH_14 which is spaced apart from the third auxiliary channel pattern DCH_13 in the second direction X and is placed in the second dummy region A3_2 between the fourth channel pattern CH_14 and the second separation pattern WLC_2.

The auxiliary channel structure DCH may penetrate a part of the mold structure ST. The auxiliary channel structure DCH penetrates the upper part of the mold structure ST, but does not come into contact with the bottom surface of the mold structure ST. In this case, the auxiliary channel structure DCH penetrates the upper part of the mold structure ST, but does not come into contact with the lowermost gate electrode layer GSL or the common source plate 105. For example, referring to FIGS. 3 and 4, the height of the lower ends of the first and third auxiliary channel patterns DCH_11 and DCH_13 may be placed at a level that is higher than the height of the lower ends of the first and third channel patterns CH_11 and CH_13.

A diameter of the auxiliary channel hole DCH_h may be smaller than a diameter of the channel hole CH_h. That is, referring to FIG. 3, a diameter r1 of the upper surface of the auxiliary channel structure DCH that is in contact with the mold structure ST may be smaller than a diameter r2 of the upper surface of the channel structure CH and a diameter r3 of the upper surface of the separation structure WLC. In some embodiments, the diameters to be described relatively for comparison may mean diameters at the same height or mean maximum diameters.

The auxiliary channel structure DCH may include multiple films. Referring to FIGS. 4 and 7, the auxiliary channel structure DCH may include at least one of a first layer 162c, a second layer 162b and a third layer 162a formed along the profile of the auxiliary channel hole DCH_h penetrating a part of the mold structure ST.

The first layer 162c may include an oxide, the second layer 162b may include a nitride, and the third layer 162a may include an oxide. In this case, the oxides included in the first layer 162c and the third layer 162a may be different from each other. Further, the oxide included in the mold structure ST and the oxide included in the first layer 162c may be different from each other. However, the technical aspects of the present disclosure are not limited thereto.

Each bit line 180 may be connected to a plurality of auxiliary channel structures DCH. For example, as shown in FIG. 4, the bit line 180 may be connected to the plurality of auxiliary channel structures DCH through the bit line contact 177.

The auxiliary channel structure DCH may be placed alternately between the channel structure CH and the separation structure WLC. For example, referring to FIG. 3, the first auxiliary channel pattern DCH_11 may be alternately placed between the first channel pattern CH_11 and the first separation pattern WLC_1 on the basis of the first direction Y. For example, in the first direction Y, a center portion of the first auxiliary channel pattern DCH_11 does not intersect with a center portion of the first channel pattern CH_11 or the first separation pattern WLC_1. The third auxiliary channel pattern DCH_13 may be alternately placed between the third channel pattern CH_13 and the first separation pattern WLC_1 on the basis of the first direction Y. For example, in the first direction Y, a center portion of the third auxiliary channel pattern DCH_13 does not intersect with a center portion of the third channel pattern CH_13 or the first separation pattern WLC_1.

On the other hand, the channel structure CH and separation structure WLC may be placed at the same position on the basis of the second direction X. For example, referring to FIG. 3, the first channel pattern CH_11 and the first separation pattern WLC_1 may be placed at the same position, and the second channel pattern CH_12 and the second separation pattern WLC_2 may be placed at the same position on the basis of the second direction X. For example, in the first direction Y, a center portion of the first channel pattern CH_11, the first separation pattern WLC_1, and the third channel pattern CH_13 may intersect with each other. In addition, in an oblique direction between the first direction Y and the second direction X, a center portion of the second channel pattern CH_12, the first auxiliary channel pattern DCH_1, and the first separation pattern WLC_1 may intersect with each other.

The auxiliary channel structure DCH and the channel structure CH adjacent to each other may form a triangular shape, and the auxiliary channel structure DCH and the separation structure WLC adjacent to each other may form a triangular shape on the basis of the direction parallel to the upper surface of the second substrate 100. For example, referring to FIG. 3, the first auxiliary channel pattern DCH_11, the first separation pattern WLC_1, and the second separation pattern WLC_2 may form a triangular shape. The first auxiliary channel pattern DCH_11, the first channel pattern CH_11, and the second channel pattern CH_12 form a triangular shape.

A distance between auxiliary channel structures DCH adjacent to each other, a distance between the auxiliary channel structure DCH and the channel structure CH adjacent to each other, and a distance between the auxiliary channel structure DCH and the separation structure WCL adjacent to each other may be formed within a specific range of the distances between the channel structures CH adjacent to each other.

For example, referring to FIG. 3, each of a first distance D1 between the first auxiliary channel pattern DCH_11 and the second auxiliary channel pattern DCH_12, a second distance D2 between the first auxiliary channel pattern DCH_11 and the first channel pattern CH_11, and a third distance D3 between the first auxiliary channel pattern DCH_11 and the first separation pattern WLC_1 may be an integral multiple of the fourth distance D4 between the first channel pattern CH_11 and the second channel pattern CH_12 or 0.5 times or more and 1.5 times or less the fourth distance D4.

The distance D1 between the auxiliary channel structures DCH adjacent to each other, the distance D2 between the auxiliary channel structure DCH and the channel structure CH adjacent to each other, and the distance D3 between the auxiliary channel structure DCH and the separation structure WCL adjacent to each other may be formed within a specific range of distances between the separation structures WLC adjacent to each other.

Each of the first distance D1 between the first auxiliary channel pattern DCH_11 and the second auxiliary channel pattern DCH_12, the second distance D2 between the first auxiliary channel pattern DCH_11 and the first channel pattern CH_11, and the third distance D3 between the first auxiliary channel pattern DCH_11 and the first separation pattern WLC_1 may be 0.5 times or more and 1.5 times or less a fifth distance D5 between the first separation pattern WLC_1 and the second separation pattern WLC_2.

In some embodiments, the first to fifth distances D1 to D5 may mean distances measured on the basis of the centers of the upper surfaces on which each pattern comes into contact with the first mold structure ST1. For examples, the first to fifth distances D1 to D5 represent pitches between the patterns.

Figure 8:
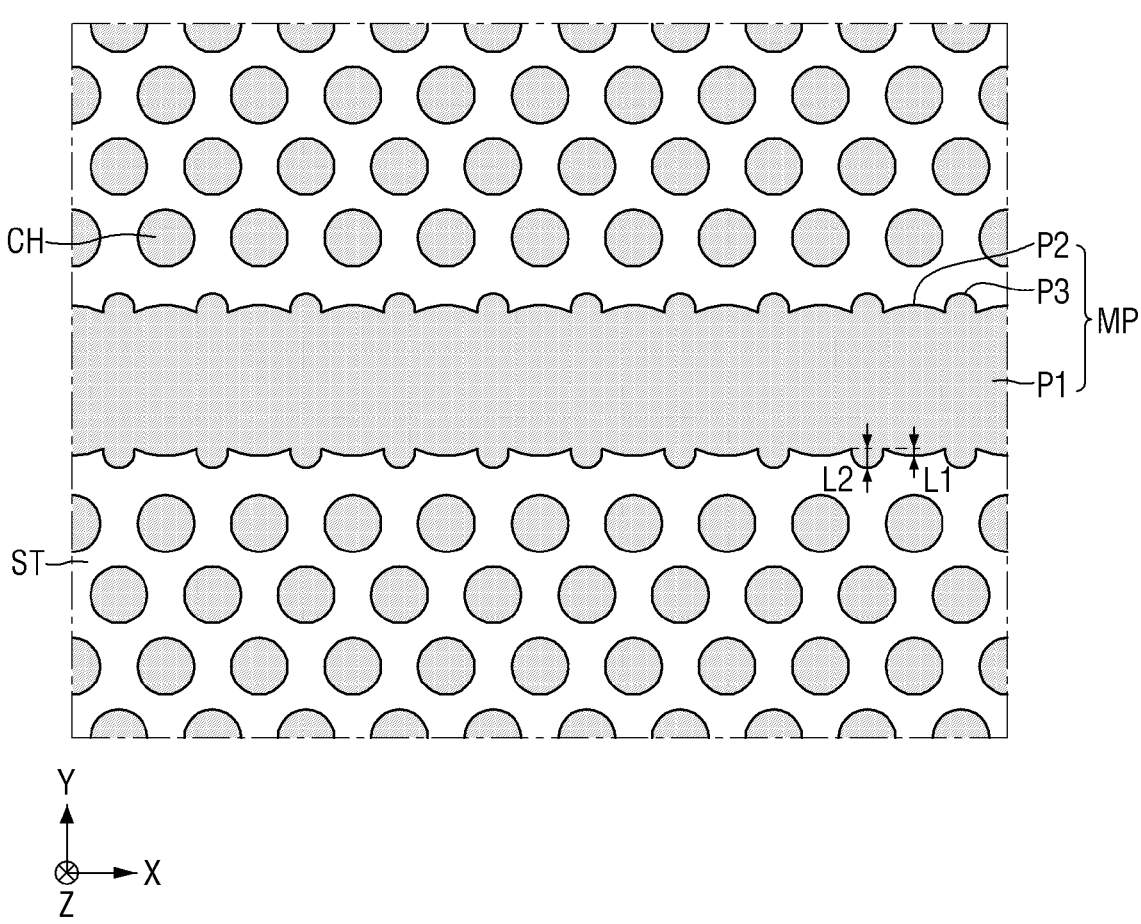
FIG. 8 is a schematic layout diagram for explaining a semiconductor device according to some embodiments.

FIG. 8 is a schematic layout diagram for explaining a semiconductor device according to some embodiments. For convenience of explanation, repeated parts of content explained using FIGS. 1 to 7 will be briefly described or omitted.

The auxiliary channel structures DCH adjacent to each other and the separation structures WLC adjacent to each other may be merged with each other. For example, the first and second auxiliary channel patterns DCH_11 and DCH_12 and the first and second separation patterns WLC_1 and WLC_2 may be merged with each other to form a single merge pattern MP on the upper surface of the mold structure ST.

Referring to FIG. 8, in this case, the merge pattern MP may include a bar-shaped first extension pattern P1 extending in the second direction X, and first and second protrusion patterns P2 and P3 protruding from the first extension pattern P1 in the first direction Y. A first length L1 by which the first protrusion pattern P2 protrudes in the first direction Y may be different from a second length L2 by which the second protrusion pattern P3 protrudes in the first direction Y.

Figure 9:
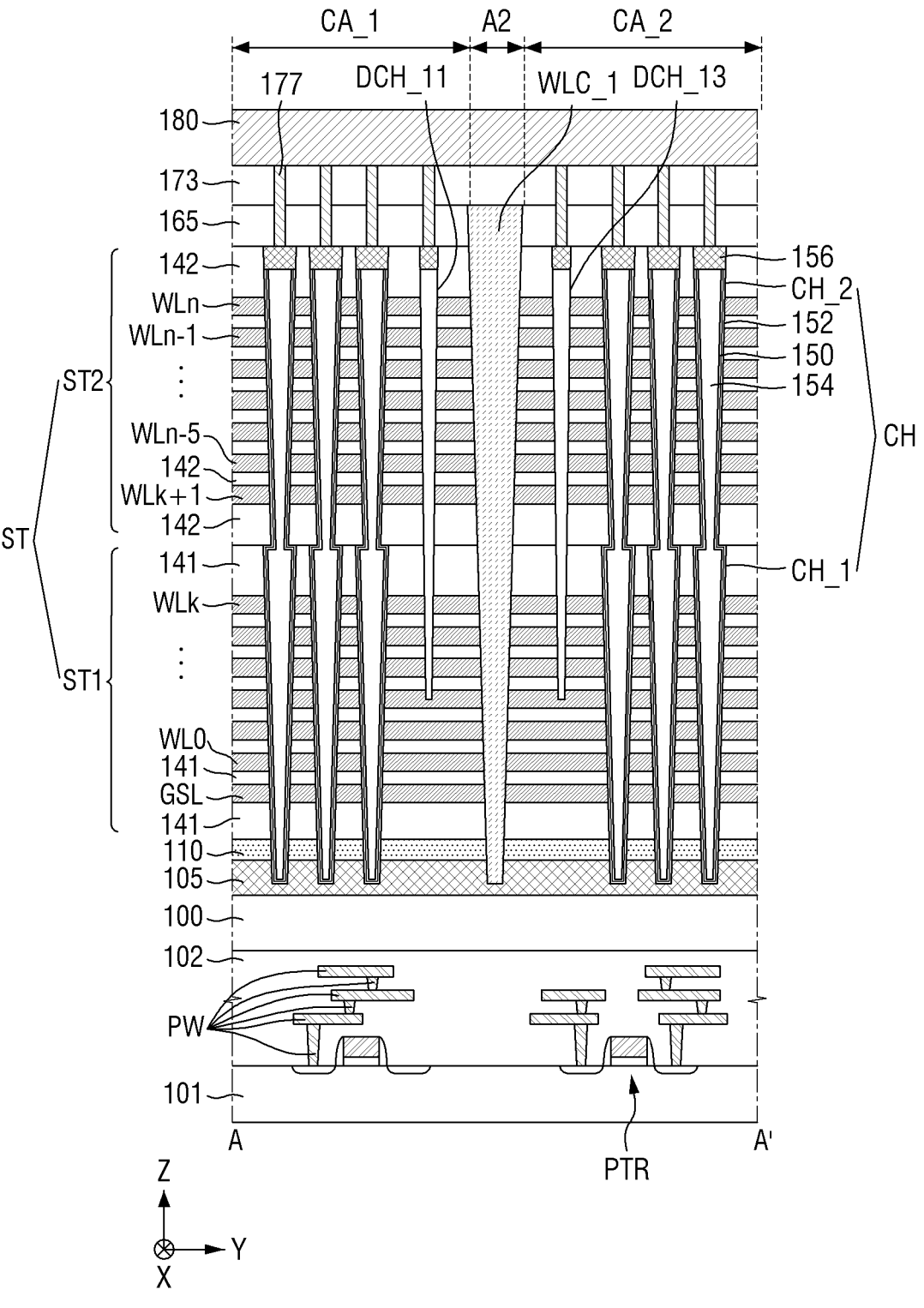
FIG. 9 is a diagram for explaining the semiconductor device according to some embodiments, and corresponding to the cross-sectional view taken along a line A-A' of FIG. 4.

FIG. 9 is a diagram for explaining the semiconductor device according to some embodiments, and corresponding to the cross-sectional view taken along a line A-A' of FIG. 4. For convenience of explanation, repeated parts of contents explained using FIGS. 1 to 8 will be briefly described or omitted.

Referring to FIG. 9, the mold structure ST may further include a second mold structure ST2 on the first mold structure ST1. The first mold structure ST1 may include the ground selection line GSL and some of the word lines WL0 to WLk. The second mold structure ST2 may include remaining word lines WLk+1 to WLn, the dummy word line DWL, the string selection line SSL, and the erasure control line ECL. Here, n is a natural number greater than k.

In some embodiments, the first mold structure ST1 may be placed on the support semiconductor layer 110. The first mold structure ST1 may include a plurality of first gate selection lines GSL and word lines WL0 to WLk and a plurality of first inter-electrode insulating layers 141 alternately stacked on the support semiconductor layer 110. For example, each of the first gate selection lines GSL and word lines WL0 to WLk and each first inter-electrode insulating layer 141 may have a layered structure extending in the first direction Y and the second direction X. The first gate selection lines GSL and word lines WL0 to WLk and the first inter-electrode insulating layer 141 may be stacked alternately in the third direction Z that intersects (e.g., perpendicular to) the upper surface of the second substrate 100.

In some embodiments, the plurality of first gate selection lines GSL and word lines WL0 to WLk may be formed from a first gate electrode layer alternately stacked with the first inter-electrode insulating layer 141 on the second substrate 100. In some embodiments, the ground selection line GSL may be a gate electrode located at the lowermost part of the plurality of first gate electrode layers.

The second mold structure ST2 may be placed on the first mold structure ST1. The second mold structure ST2 may include a plurality of word lines WLk+1 to WLn and a plurality of second inter-electrode insulating layers 142 that are alternately stacked on the first mold structure ST1. For example, each of the word lines WLk+1 to WLn and each second inter-electrode insulating layer 142 may have a layered structure extending in the first direction Y and the second direction X.

The gate electrode layer may include or may be formed of one of doped semiconductor materials (doped silicon, doped germanium, etc.), conductive metal nitrides (titanium nitride, tantalum nitride, etc.), metals (tungsten, titanium, tantalum, nickel, etc.), and metal-semiconductor compounds (tungsten silicide, cobalt silicide, titanium silicide, etc.). An etching process may be performed such that the gate electrode layer is etched to form the first gate selection lines GSL, word lines WL0 to WLk, and the word lines WLk+1 to WLn.

The first inter-electrode insulating layer 141 and the second inter-electrode insulating layer 142 may include an insulating material. For example, the first inter-electrode insulating layer 141 and the second inter-electrode insulating layer 142 may include, but are not limited to, silicon oxide.

The first channel structure CH_1 may penetrate the first mold structure ST1, and the second channel structure CH_2 may penetrate the second mold structure ST2. The first and second channel structures CH_1 and CH_2 may be continuously connected. That is, the first and second channel structures CH_1 and CH_2 may form a single body.

The plurality of first and second channel structures CH_1 and CH_2 may extend in a direction intersecting the plurality of gate selection lines GSL and word lines WL0 to WLn. For example, the first and second channel structures CH_1 and CH_2 may extend in the third direction Z.

A width of a lower surface of the second channel structure CH_2 in the first direction Y may be smaller than a width of an upper surface of the second channel structure CH_2 in the first direction Y. The width of the second channel structure CH_2 in the first direction Y may increase, as it extends away from the upper surface of the second substrate 100. This may be due to the characteristics of the etching process for forming the second channel structure CH_2.

The width of the uppermost surface of the first channel structure CH_1 in the first direction Y may be greater than the width of the lowermost surface of the second channel structure CH_2 in the first direction Y. For example, the side walls of the single body (i.e., channel structure CH) formed from the first and second channel structures CH_1 and CH_2 may have a step. This may be due to the fact that the etching process of penetrating the first mold structure ST1 and the etching process of penetrating the second mold structure ST2 are performed separately.

The second channel structure CH_2 may include a semiconductor pattern 150, an information storage pattern 152, and a filling pattern 154. The semiconductor pattern 150 may penetrate the first mold structure ST1 and the second mold structure ST2 and extend in the third direction Z.

The description of the semiconductor pattern 150, the information storage pattern 152, and the filling pattern 154 of the first channel structure CH_1 described above may be similarly applied to the description of the semiconductor pattern 150, the information storage pattern 152, and the filling pattern 154 of the second channel structure CH_2.

In some embodiments, the second channel structure CH_2 may further include a channel pad 156. The channel pad 156 may be formed to be connected to the upper part of the semiconductor pattern 150. For example, the channel pad 156 may be formed inside the second inter-electrode insulating layer 142 placed at the uppermost portion of the second mold structure ST2. The description of the material of the channel pad 156 of the first channel structure CH_1 described above may be similarly applied to the description of the material of the channel pad 156 of the second channel structure CH_2.

In some embodiments, the plurality of second channel structures CH_2 may be arranged in a zigzag form to further improve the degree of integration of the non-volatile memory device.

The first mold structure ST1 and the second mold structure ST2 may be separated by the first separation pattern WLC_1. The first separation pattern WLC_1 may extend in a direction that intersects the bit line 180. For example, the first separation pattern WLC_1 may extend in the third direction Z to completely cut the first mold structure ST1 and the second mold structure ST2. Therefore, the plurality of first gate selection lines GSL, word lines WL0 to WLk, and word lines WLk+1 to WLn may be cut by the first separation pattern WLC_1.

The auxiliary channel structure DCH may be formed to penetrate the entire second mold structure ST2 and a part of the first mold structure ST1. For example, referring to FIG. 9, the first and third auxiliary channel patterns DCH_11 and DCH_13 may penetrate the entire second mold structure ST2 and a part of the upper part of the first mold structure ST1.

Figure 10:
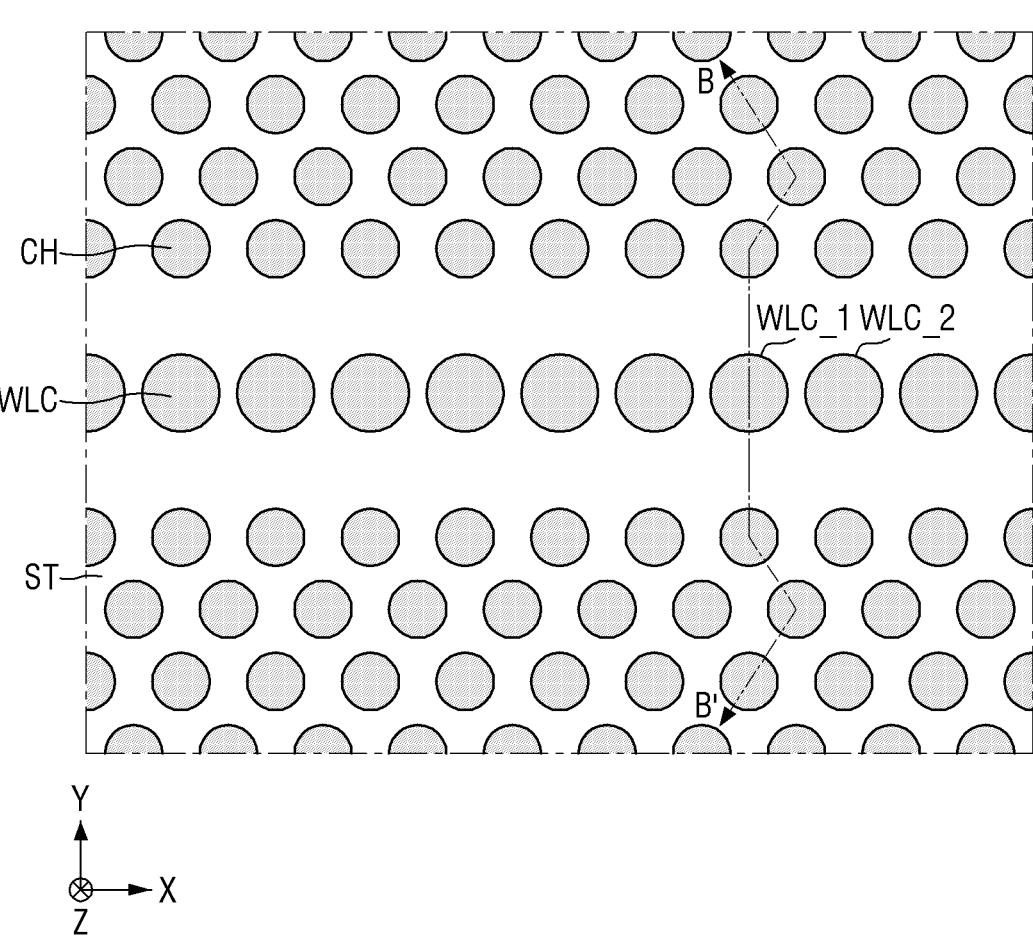
FIG. 10 is a schematic layout diagram for explaining a semiconductor device according to some embodiments.
Figure 11:
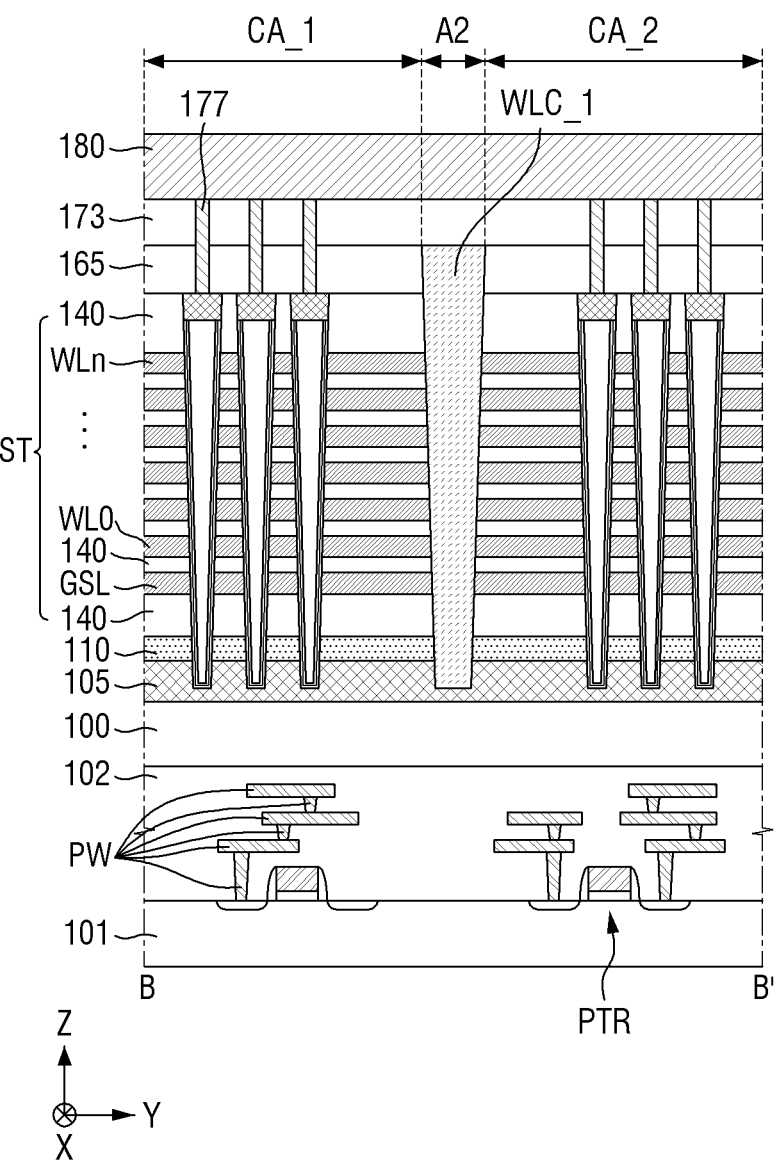
FIG. 11 is a diagram schematically showing a cross-sectional view taken along a line B-B' of FIG. 10.
Figure 12:
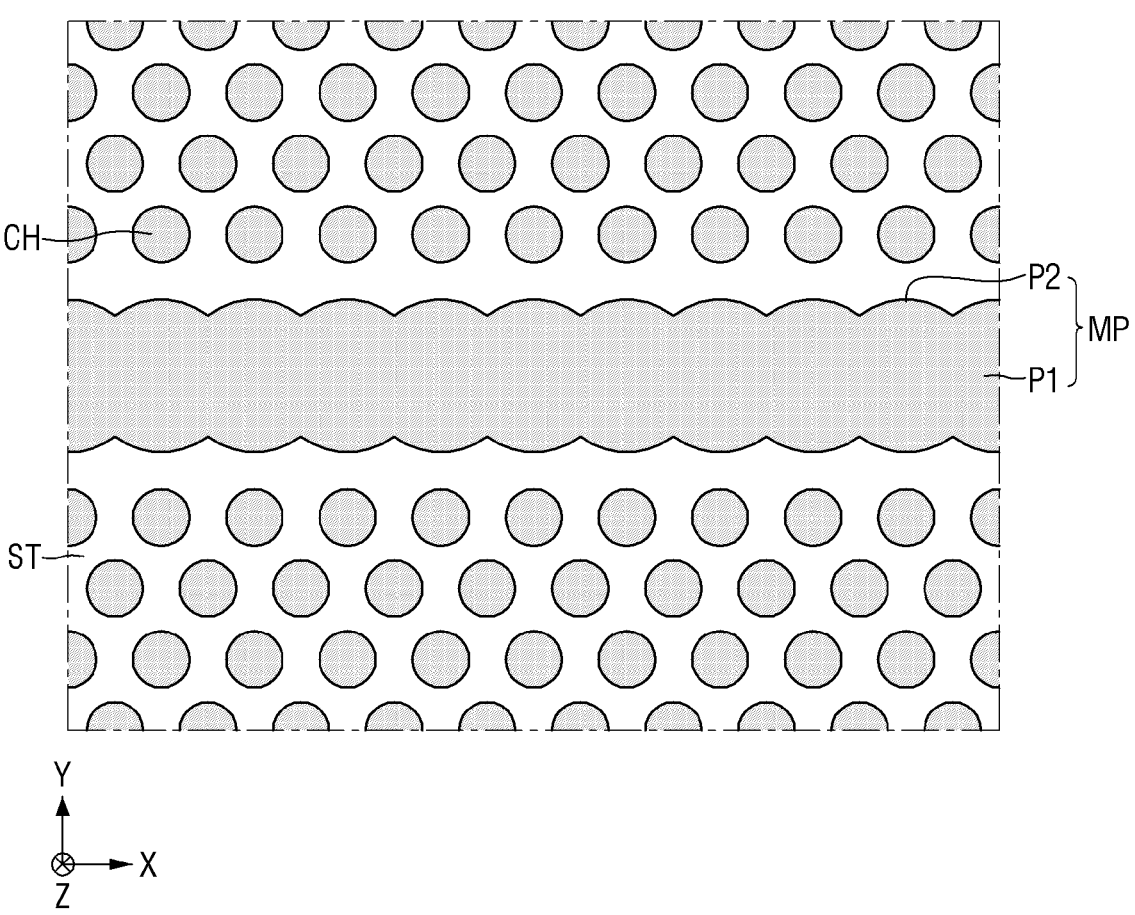
FIG. 12 is a schematic layout diagram for explaining the semiconductor device according to some embodiments.

FIG. 10 is a schematic layout diagram for explaining a semiconductor device according to some embodiments. FIG. 11 is a diagram schematically showing a cross-sectional view taken along a line B-B' of FIG. 10. FIG. 12 is a schematic layout diagram for explaining the semiconductor device according to some embodiments. For convenience of explanation, repeated parts of contents explained using FIGS. 1 to 9 will be briefly described or omitted.

Referring to FIGS. 10 and 11, the auxiliary channel structure DCH may not be formed between the separation structure WLC and the channel structure CH. In this case, the auxiliary channel structure DCH may not be formed on the upper surface of the mold structure ST.

Referring to FIG. 12, the first and second separation patterns WLC_1 and WLC_2 may be merged with each other to form a single merge pattern MP.

In this case, the merge pattern MP may include a bar-shaped first extension pattern P1 extending in the second direction X, and a first protrusion pattern P2 that protrudes from the first extension pattern P1 in the first direction Y.

Figure 13:
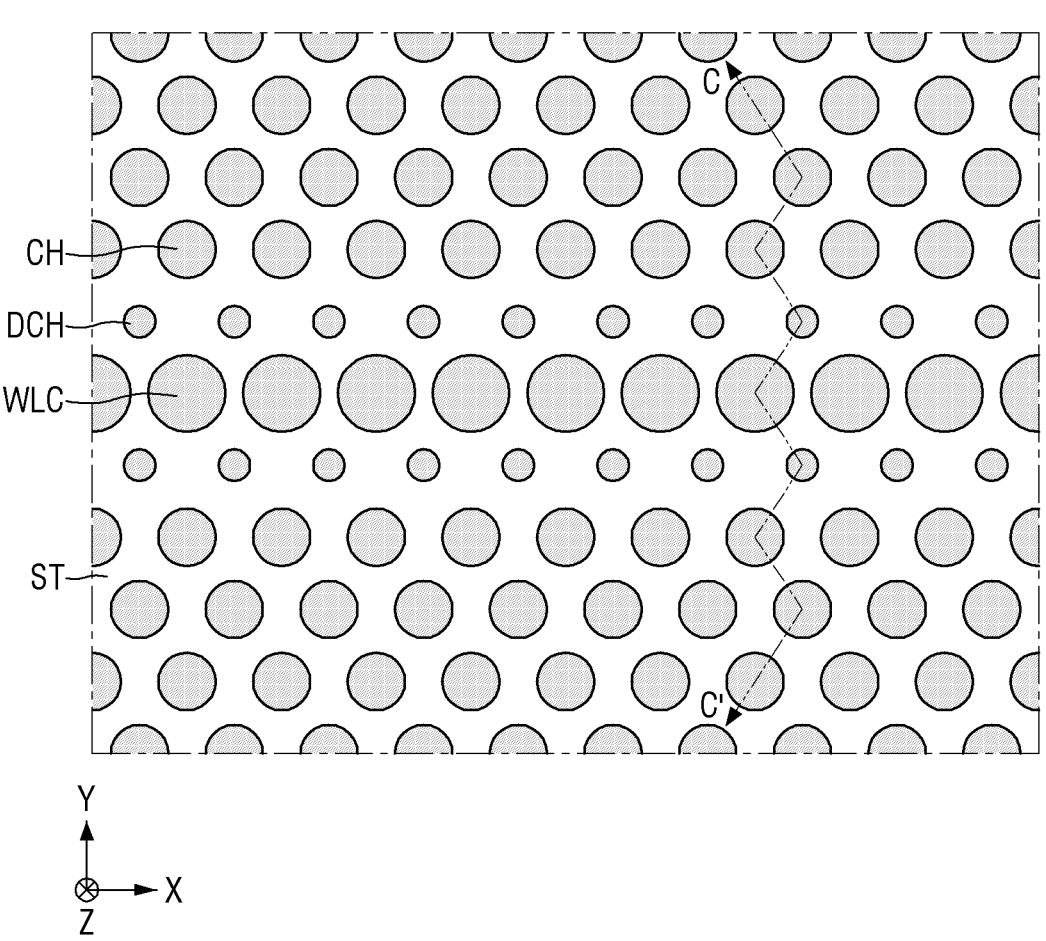
FIG. 13 is a schematic layout diagram for explaining a semiconductor device according to some embodiments.
Figure 14:
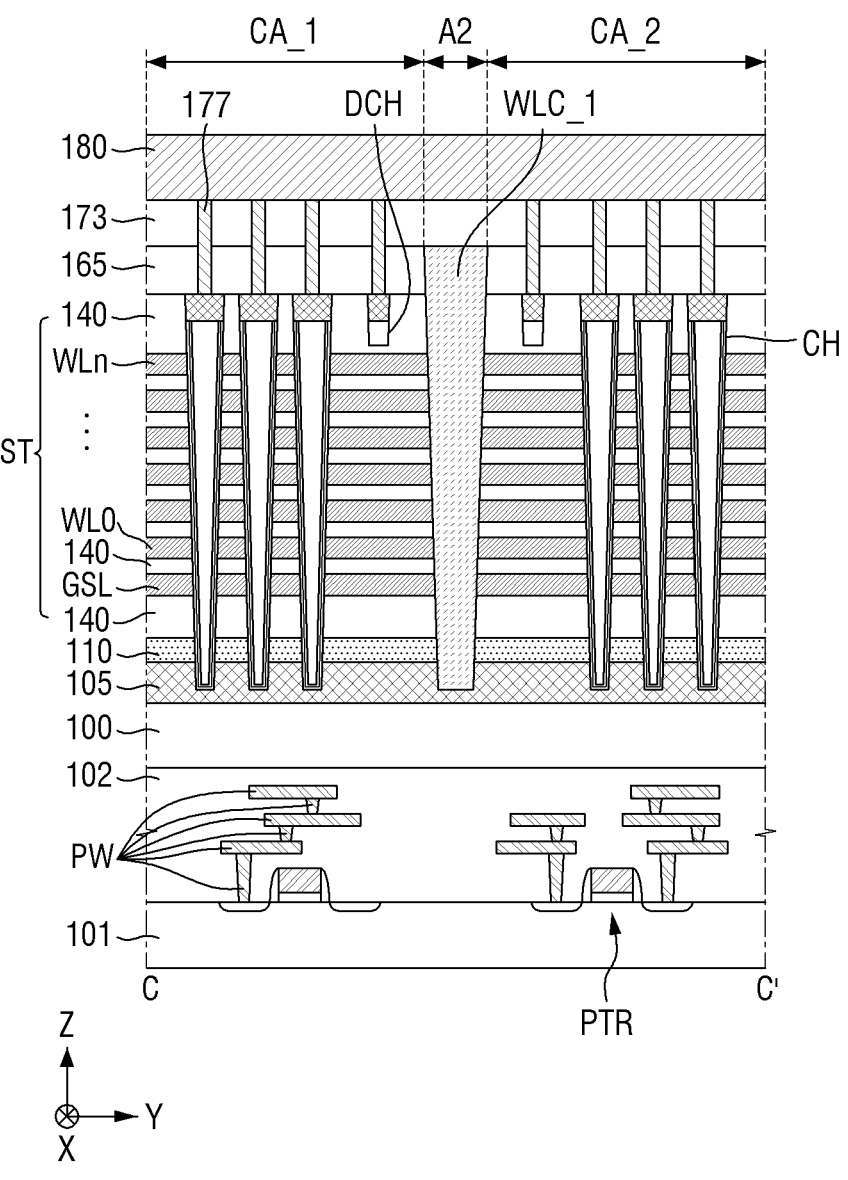
FIG. 14 is a diagram schematically showing a cross-sectional view taken along a line C-C' of FIG. 13.

FIG. 13 is a schematic layout diagram for explaining a semiconductor device according to some embodiments. FIG. 14 is a diagram schematically showing a cross-sectional view taken along a line C-C' of FIG. 13. For convenience of explanation, repeated parts of contents explained using FIGS. 1 to 12 will be briefly described or omitted.

Referring to FIGS. 13 and 14, the auxiliary channel structure DCH may be partially formed between the separation structure WLC and the channel structure CH. In this case, the auxiliary channel structure DCH may be formed to have a smaller diameter and depth than the case of FIG. 4. For example, referring to FIG. 14, the auxiliary channel structure DCH is in contact with the uppermost insulating layer 140 of the mold structure ST, but is not in contact with the uppermost gate electrode layer WLn.

In this case, an oxide layer may be formed inside the auxiliary channel structure DCH. However, the technical aspects of the present disclosure are not limited thereto.

FIGS. 15 to 19 are intermediate step diagrams for explaining a method for fabricating a semiconductor device according to some embodiments. For convenience of explanation, repeated parts of contents explained using FIGS. 1 to 7 will be briefly described or omitted. In some embodiments, after the peripheral circuit region PA is formed, the cell array region CA may be formed on the peripheral circuit region PA. However, the technical aspects of the present disclosure are not limited thereto. In FIGS. 15 to 19, for convenience of explanation, the explanation will be provided except for the peripheral circuit region PA.

Figure 15:
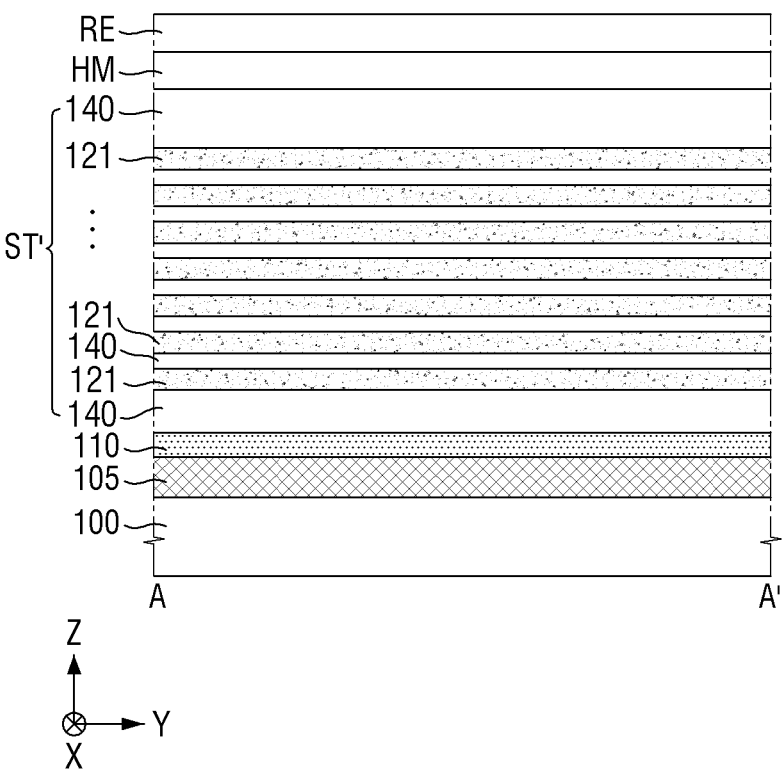
FIGS. 15 to 19 are intermediate step diagrams for explaining a method for fabricating a semiconductor device according to some embodiments.

Referring to FIG. 15, the common source plate 105 and the support semiconductor layer 110 may be formed on the second substrate 100. A preliminary mold structure ST' including an inter-electrode insulating layer 140 and a sacrificial layer 121 stacked sequentially may be formed on the common source plate 105. The sacrificial layer 121 may include a material having an etching selectivity with the inter-electrode insulating layer 140. For example, when the inter-electrode insulating layer 140 includes silicon oxide, the sacrificial layer 121 may include polysilicon.

A hard mask film HM and a resist film RE may be formed on the preliminary mold structure ST'.

Figure 16:
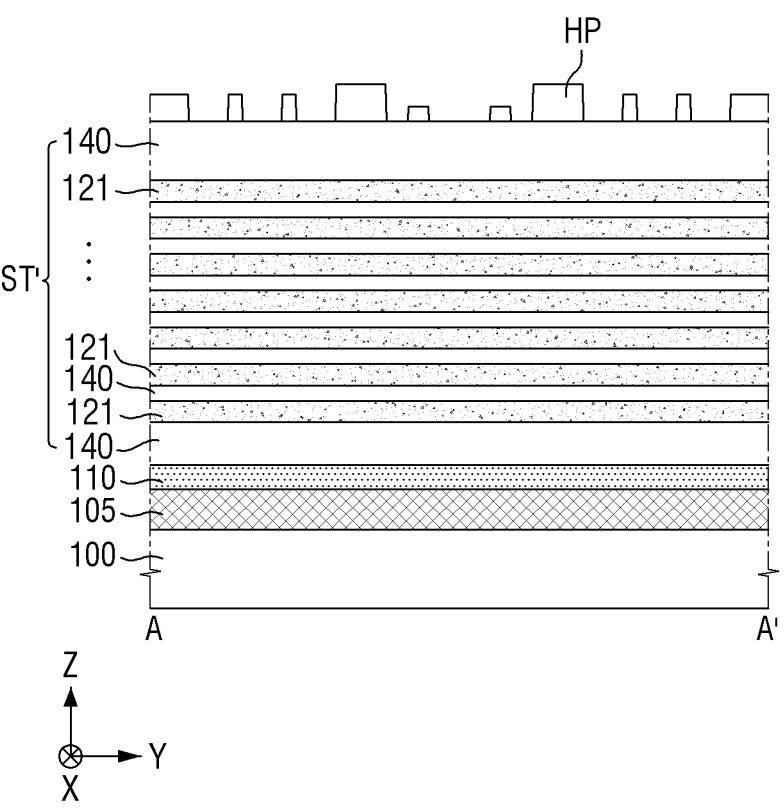

Referring to FIG. 16, the hardmask film HM may be formed as a hardmask pattern HP. Although not specifically shown, the resist film RE may be patterned into a resist pattern using a photomask pattern, and the hard mask film HM may be patterned into a hard mask pattern HP using the resist pattern.

Figure 17:
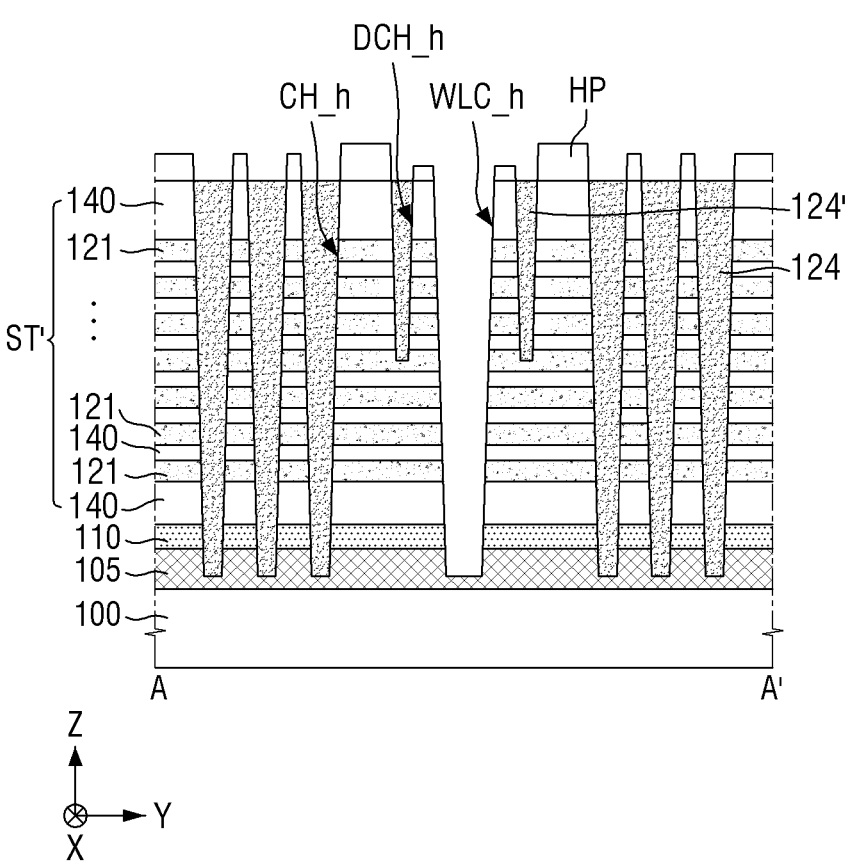

Referring to FIG. 17, the channel hole CH_h, the separation structure hole WLC_h, and the auxiliary channel hole DCH_h penetrating the preliminary mold structure ST' may be formed simultaneously, using the hard mask pattern HP.

A channel sacrifice pattern 124 may be formed inside the channel hole CH_h. An auxiliary channel sacrifice pattern 124' may be formed inside the auxiliary channel hole DCH_h.

The channel sacrifice pattern 124 may include, for example, polysilicon, silicon oxide, silicon nitride, silicon oxynitride or a combination thereof.

The hard mask pattern HP may be removed.

Figure 18:
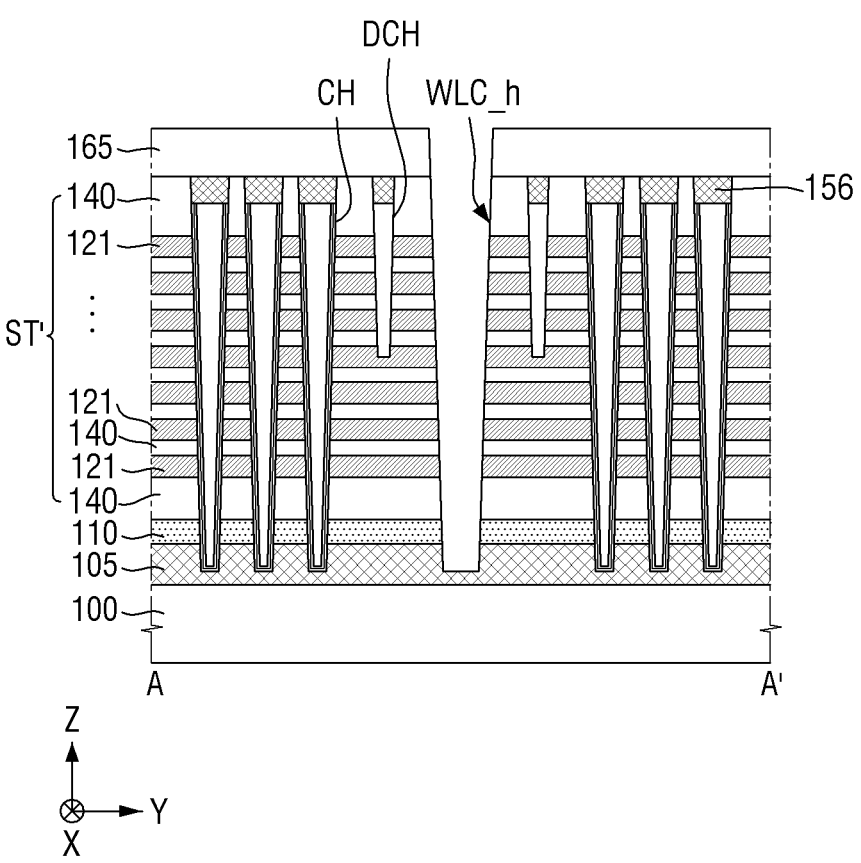

Referring to FIG. 18, the channel sacrifice pattern 124 may be removed to form the channel structure CH, and the auxiliary channel sacrifice pattern 124' may be removed to form the auxiliary channel structure DCH. Channel pads 156 may be formed on the channel structure CH and the auxiliary channel structure DCH. The first interlayer insulating film 165 may be formed on the inter-electrode insulating layer 140.

According to some embodiments, as the auxiliary channel structure DCH is formed between the separation structure WLC and the channel structure CH, in the etching process for forming the separation structure hole WLC_h and the channel hole CH_h, a difference in etch loading between the patterns may be reduced, while further reducing the height difference of the hard mask pattern HP. Furthermore, according to some embodiments, the process for forming the pattern may be simplified by simultaneously forming the channel hole CH_h, the separation structure hole WLC_h, and the auxiliary channel hole DCH_h.

Figure 19:
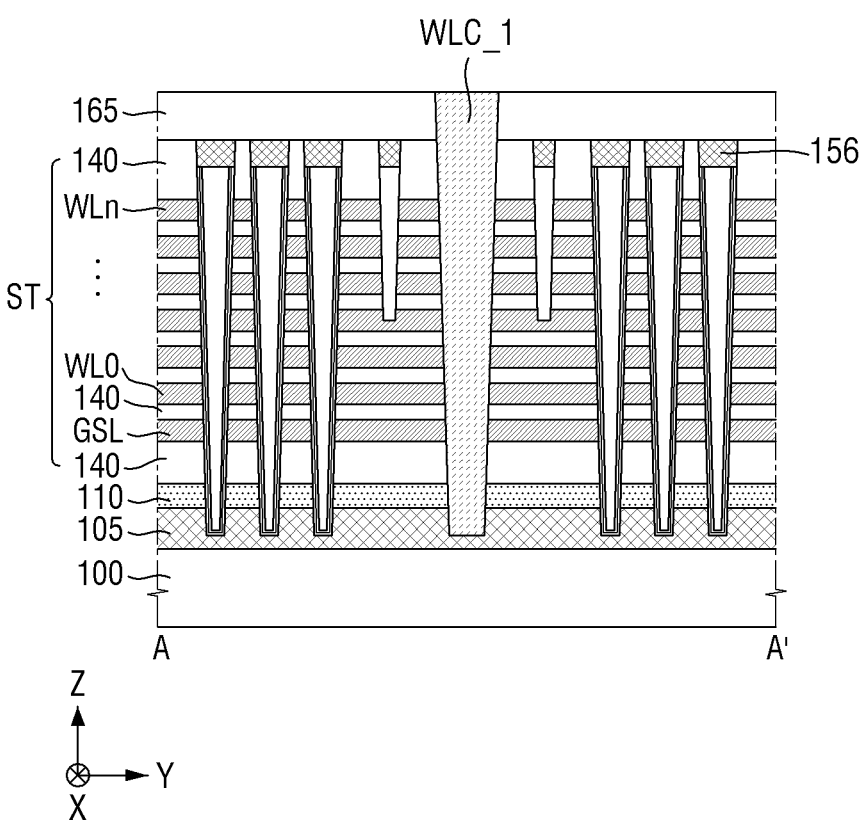

Referring to FIG. 19, the separation pattern WLC may be formed inside the separation structure hole WLC_h. The separation structure hole WLC_h may be filled with a separation structure hole WLC_h may be filled with a insulating material to form the separation pattern WLC. The type of the insulating material is not limited, but may include, for example, an oxide.

The gate electrode layers GSL and WL0 to WLn may each be formed in the space from which the sacrificial layer 121 is removed. That is, the sacrificial layer 121 may be replaced with each of the gate selection lines GSL and word lines WL0 to WLn, through a replacement metal gate process. As a result, the mold structure ST of FIG. 4 in which the auxiliary channel structure DCH is formed in the outermost regions of the first and second cell array regions CA_1 and CA_2 may be formed.

Figure 20:
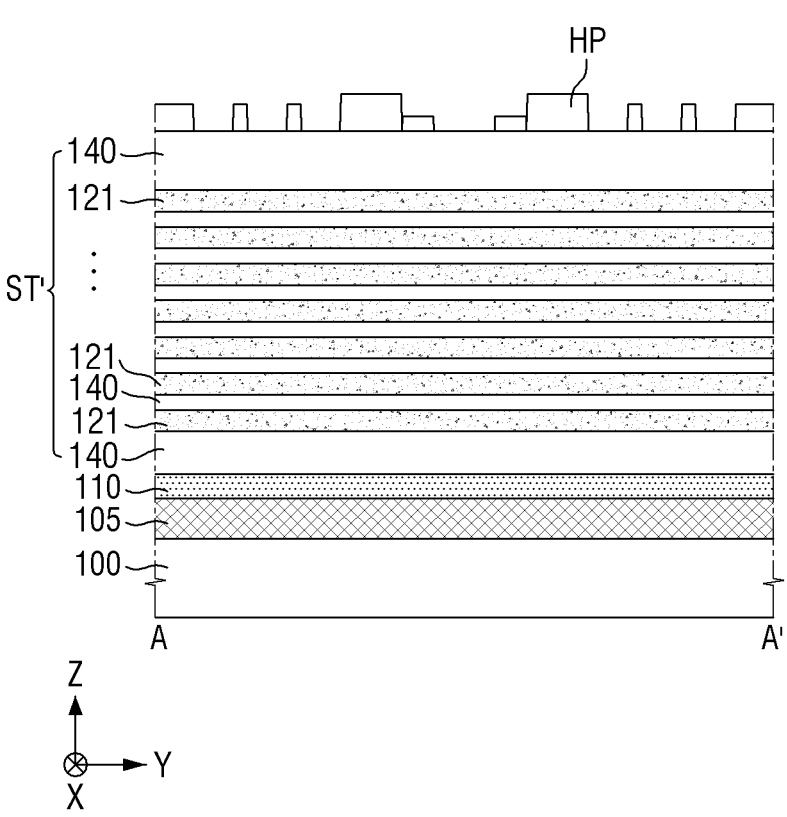
FIGS. 20 and 21 are intermediate step diagrams for explaining a method for fabricating a semiconductor device according to some embodiments.
Figure 21:
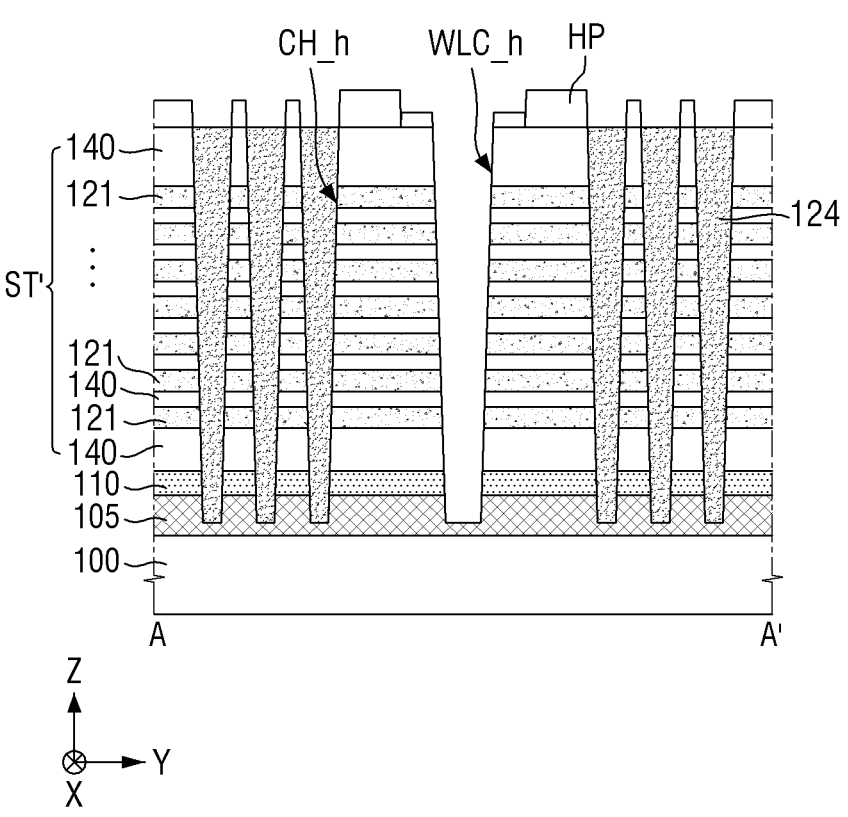

FIGS. 20 to 21 are intermediate step diagrams for explaining a method for fabricating a semiconductor device according to some embodiments. For convenience of explanation, repeated parts of contents explained using FIGS. 1 to 19 will be briefly described or omitted.

Referring to FIG. 20, after forming the hard mask film and the resist film, the hard mask film may be patterned into the hard mask pattern HP, using the photomask pattern and the resist pattern. In this case, only a part of the hard mask film may be patterned in the region in which the auxiliary channel structure DCH is formed between the separation structure WLC and the channel structure CH. That is, only a part of the hard mask film may be etched and the bottom surface of the hard mask film may not be patterned.

Referring to FIG. 21, the channel hole CH_h and the separation structure hole WLC_h penetrating the preliminary mold structure ST' may be simultaneously formed, using the hard mask pattern HP, only a part of which is patterned. In this case, the auxiliary channel structure DCH may not be formed on the upper surface of the preliminary mold structure ST'. For example, as in FIGS. 10 and 11, the auxiliary channel structure DCH may not be formed between the separation structure WLC and the channel structure CH. Next, the channel sacrifice pattern 124 may be formed in the channel hole CH_h.

Figure 22:
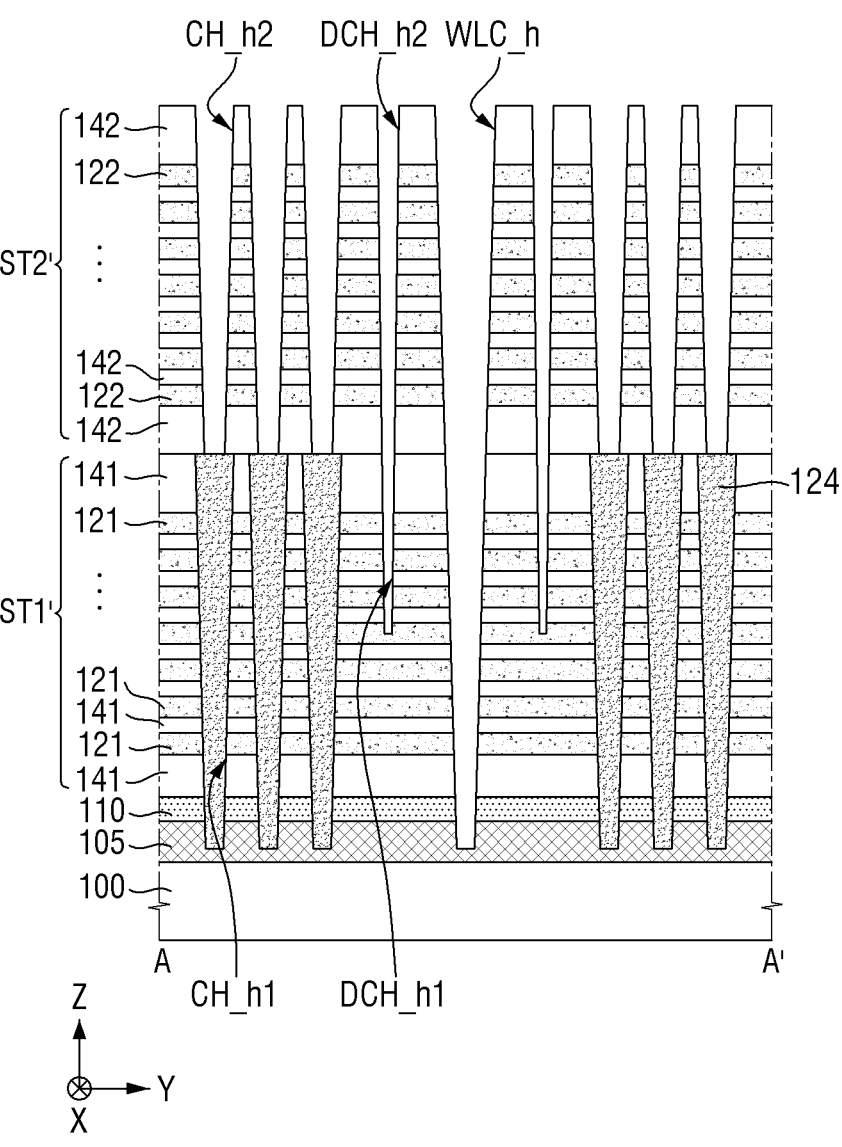
FIG. 22 is an intermediate step diagram for explaining the method for fabricating the semiconductor device according to some embodiments.

FIG. 22 is an intermediate step diagram for explaining the method for fabricating the semiconductor device according to some embodiments. For convenience of explanation, repeated parts of contents explained using FIGS. 1 to 21 will be briefly described or omitted.

Although not specifically shown, the first channel hole CH_h1 and the first auxiliary channel hole DCH_h1 penetrating the first pre-molded structure ST1' may be formed simultaneously, using the lower hard mask pattern.

The channel sacrifice pattern 124 may be formed inside the first channel hole CH_h1. The auxiliary channel sacrifice pattern 124' may be formed inside the first auxiliary channel hole DCH_h1. After that, the auxiliary channel sacrifice pattern 124' may be removed.

A second preliminary mold structure ST2' including a second inter-electrode insulating layer 142 and a second sacrificial layer 122 sequentially stacked on the first preliminary mold structure ST1' may be formed. The second sacrificial layer 122 may include a material having an etching selectivity with the second inter-electrode insulating layer 142. For example, when the second inter-electrode insulating layer 142 includes silicon oxide, the second sacrificial layer 122 may include polysilicon.

For example, the second sacrificial layer 122 may include the same material as the first sacrificial layer 121, and the second inter-electrode insulating layer 142 may include the same material as the first inter-electrode insulating layer 141.

Although not specifically shown, a patterned upper hard-mask pattern may be formed on the second preliminary mold structure ST2'.

The second channel hole CH_h2, the separation structure hole WLC_h, and the second auxiliary channel hole DCH_h2 that penetrate the second preliminary mold structure ST2' may be formed at the same time.

In this case, as shown in FIG. 9, the auxiliary channel structure DCH may be formed to penetrate the entire second mold structure ST2 and a part of the first mold structure ST1.

Figure 23:
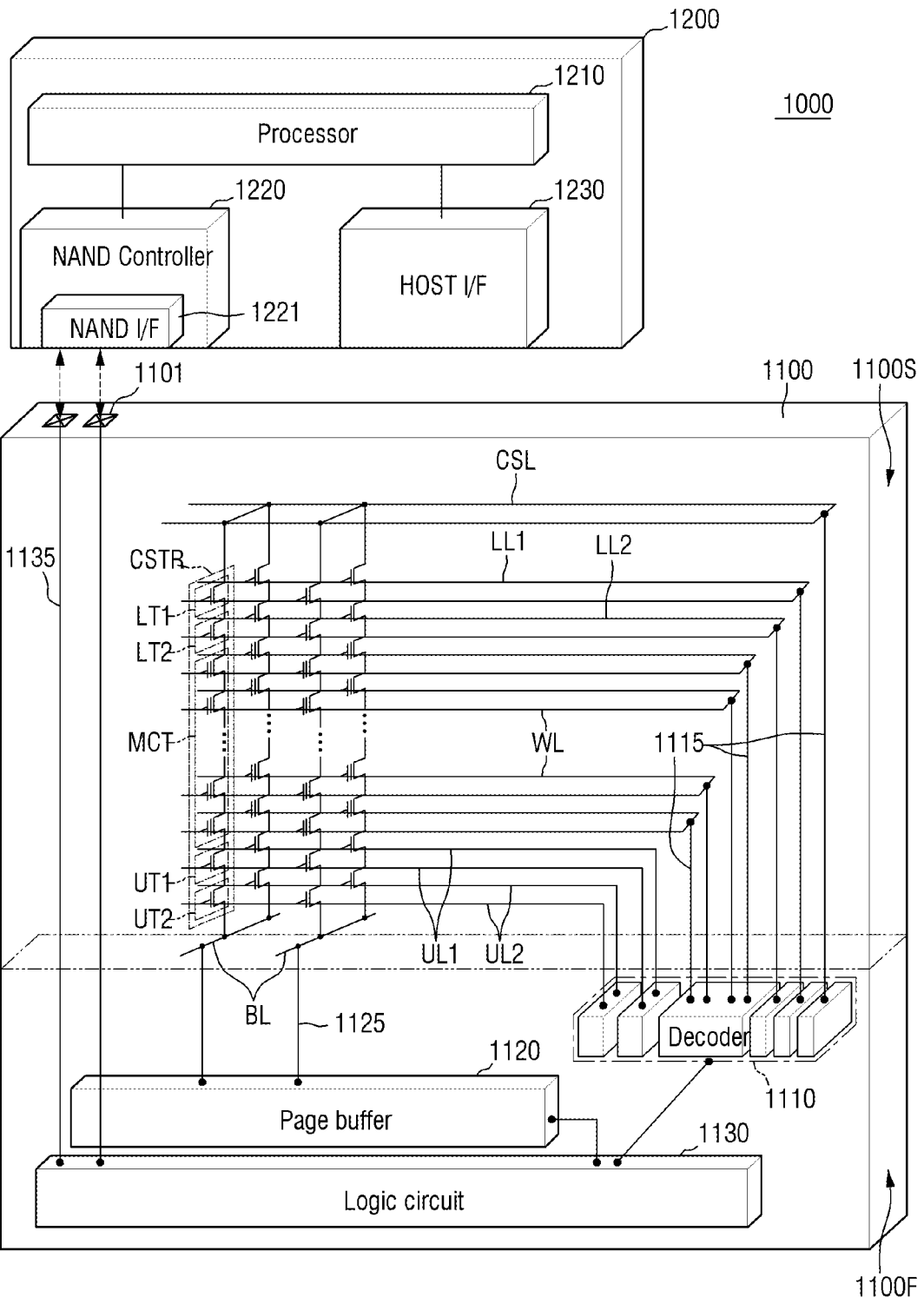
FIG. 23 is an exemplary block diagram for explaining an electronic system according to some embodiments.
Figure 24:
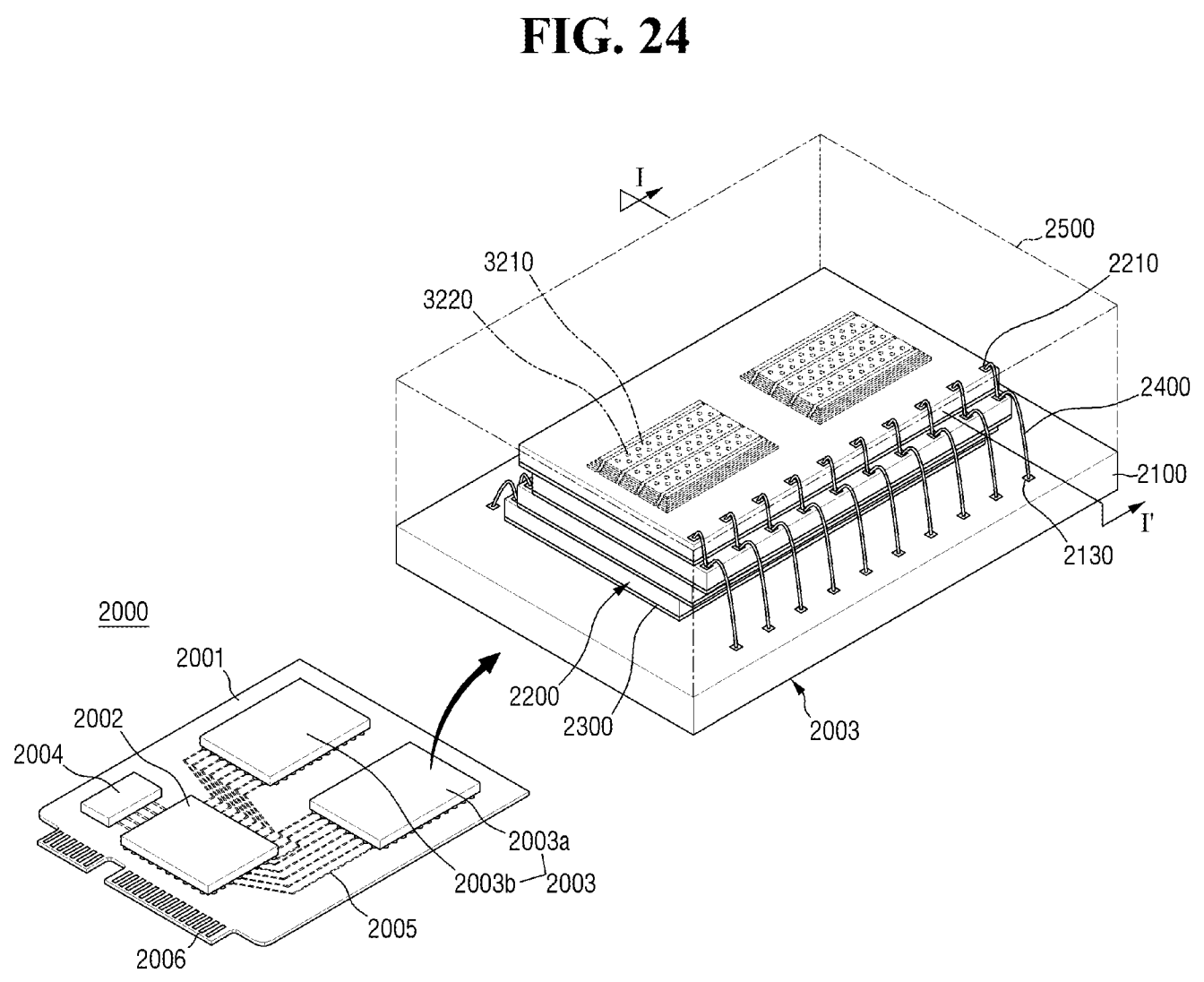
Figure 25:
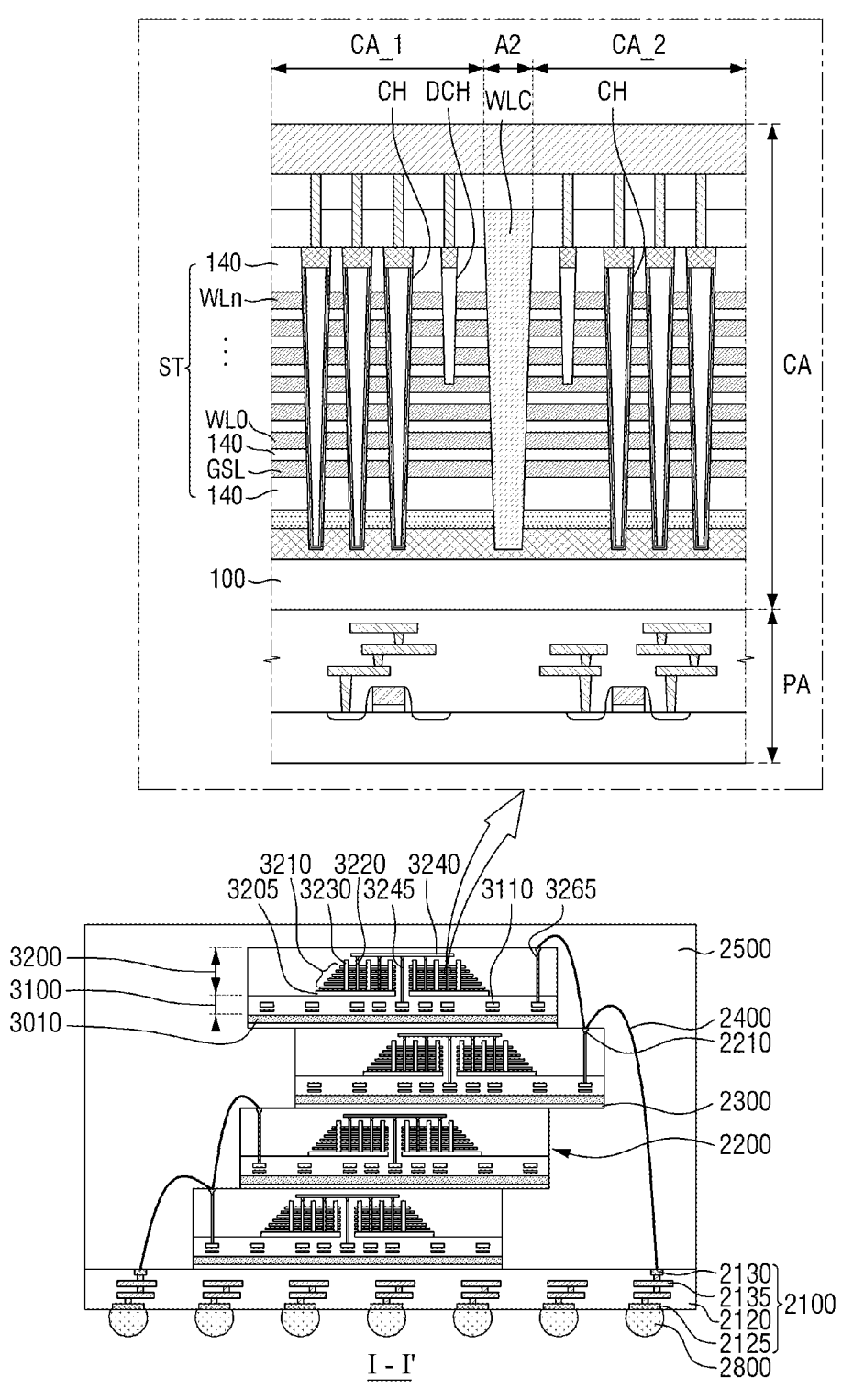
FIG. 25 is a schematic cross-sectional view taken along a line I-I' of FIG. 24.

FIG. 23 is an exemplary block diagram for explaining an electronic system according to some embodiments. FIG. 24 is an exemplary perspective view for explaining the electronic system according to some embodiments. FIG. 25 is a schematic cross-sectional view taken along a line I-I' of FIG. 24.

Referring to FIG. 23, an electronic system 1000 according to some embodiments may include a semiconductor device 1100, and a controller 1200 that is electrically connected to the semiconductor device 1100. The electronic system 1000 may be a storage device that includes one or multiple semiconductor devices 1100, or an electronic device that includes the storage device. For example, the electronic system 1000 may be an SSD device (solid state drive device), a USB (Universal Serial Bus), a computing system, a medical device or a communication device that includes one or multiple semiconductor devices 1100.

The semiconductor device 1100 may be a non-volatile memory device, and for example, may be a NAND flash memory device. The semiconductor device 1100 may include a first structure 1100F, and a second structure 1100S on the first structure 1100F. In some embodiments, the first structure 1100F may also be placed next to the second structure 1100S. The first structure 1100F may be a peripheral circuit structure that includes a decoder circuit 1110, a page buffer 1120, and a logic circuit 1130. The second structure 1100S may be a memory cell structure that includes a bit line BL, a common source line CSL, word lines WL, first and second gate upper lines UL1 and UL2, first and second gate lower lines LL1 and LL2, and memory cell strings CSTR between the bit line BL and the common source line CSL.

In the second structure 1100S, each memory cell string CSTR may include lower transistors LT1 and LT2 adjacent to the common source line CSL, upper transistors UT1 and UT2 adjacent to the bit line BL, and a plurality of memory cell transistors MCT placed between the lower transistors LT1 and LT2 and the upper transistors UT1 and UT2. The number of lower transistors LT1 and LT2 and the number of upper transistors UT1 and UT2 may be variously changed depending on the embodiments.

In some embodiments, the upper transistors UT1 and UT2 may include a string selection transistor, and the lower transistors LT1 and LT2 may include a ground selection transistor. The first and second gate lower lines LL1 and LL2 may each be gate electrodes of the lower transistors LT1 and LT2. The word lines WL may be gate electrodes of the memory cell transistors MCT, and the first and second gate upper lines UL1 and UL2 may each be gate electrodes of the upper transistors UT1 and UT2.

In some embodiments, the lower transistors LT1 and LT2 may include a lower erasure control transistor LT1 and a ground selection transistor LT2 connected in series. The upper transistors UT1 and UT2 may include a string selection transistor UT1 and an upper erasure control transistor UT2 connected in series. At least one of the lower erasure control transistor LT1 and the upper erasure control transistor UT1 may be used in an erasing operation for deleting the data stored in the memory cell transistor MCT by utilizing a gate induced drain leakage (GIDL) phenomenon.

The common source line CSL, the first and second gate lower lines LL1 and LL2, the word lines WL, and the first and second gate upper lines UL1 and UL2 may be electrically connected to the decoder circuit 1110 through first connection wirings 1115 that extend from the inside of the first structure 1100F to the second structure 1100S. The bit lines BL may be electrically connected to the page buffer 1120 through second connection wirings 1125 that extend from the inside of the first structure 1100F to the second structure 1100S.

In the first structure 1100F, the decoder circuit 1110 and the page buffer 1120 may execute the control operation on at least one selection memory cell transistor among the plurality of memory cell transistors MCT. The decoder circuit 1110 and the page buffer 1120 may be controlled by the logic circuit 1130. The semiconductor device 1100 may communicate with the controller 1200 through an I/O pad 1101 that is electrically connected to the logic circuit 1130. The I/O pad 1101 may be electrically connected to the logic circuit 1130 through an I/O connection wiring 1135 extending from the inside of the first structure 1100F to the second structure 1100S.

The controller 1200 may include a processor 1210, a NAND controller 1220, and a host interface 1230. According to embodiments, the electronic system 1000 may include a plurality of semiconductor devices 1100, and in this case, the controller 1200 may control the plurality of semiconductor devices 1100.

The processor 1210 may control the overall operations of the electronic system 1000 including the controller 1200. The processor 1210 may operate according to a predetermined firmware, and may control the NAND controller 1220 to access the semiconductor device 1100. The NAND controller 1220 may include a NAND interface 1221 that processes communication with the semiconductor device 1100. Control command for controlling the semiconductor device 1100, data to be recorded in the memory cell transistors MCT of the semiconductor device 1100, data to be read from the memory cell transistors MCT of the semiconductor device 1100, and the like may be transmitted through the NAND interface 1221. The host interface 1230 may provide a communication function between the electronic system 1000 and an external host. When the control command is received from the external host through the host interface 1230, the processor 1210 may control the semiconductor device 1100 in response to the control command.

Referring to FIG. 24, a semiconductor memory system 2000 according to some embodiments may include a main board 2001, a controller 2002 mounted on the main board 2001, one or more non-volatile memory packages 2003, and a DRAM 2004. The non-volatile memory package 2003 and the DRAM 2004 may be connected to the controller 2002 by wiring patterns 2005 formed on the main board 2001.

The main board 2001 may include a connector 2006 including a plurality of pins coupled to an external host. In the connector 2006, the number and arrangement of the plurality of pins may vary depending on a communication interface between the semiconductor memory system 2000 and the external host. In some embodiments, the semiconductor memory system 2000 may communicate with the external host according to any one of interfaces such as M-Phy for USB (Universal Serial Bus), PCI-Express (Peripheral Component Interconnect Express), SATA (Serial Advanced Technology Attachment), and UFS (Universal Flash Storage). In some embodiments, the semiconductor memory system 2000 may operate by power supplied from the external host through the connector 2006. The semiconductor memory system 2000 may further include a PMIC (Power Management Integrated Circuit) that distributes the power supplied from the external host to the controller 2002 and the non-volatile memory package 2003.

The controller 2002 may record data in the non-volatile memory package 2003 or read data from the non-volatile memory package 2003, and may improve the operating speed of the semiconductor memory system 2000.

The DRAM 2004 may be a buffer memory for relieving a speed difference between the non-volatile memory package 2003, which is a data storage space, and the external host. The DRAM 2004 included in the semiconductor memory system 2000 may also operate as a kind of cache memory, and may also provide a space for temporarily storing data in the control operation on the non-volatile memory package 2003. When the DRAM 2004 is included in the semiconductor memory system 2000, the controller 2002 may further include a DRAM controller for controlling the DRAM 2004, in addition to a NAND controller for controlling the non-volatile memory package 2003.

The non-volatile memory package 2003 may include first and second semiconductor memory packages 2003a and 2003b that are spaced apart from each other. The first and second semiconductor memory packages 2003a and 2003b may each be a semiconductor memory package that includes a plurality of semiconductor chips 2200. The first and second semiconductor memory packages 2003a and 2003b may each include a package substrate 2100, semiconductor chips 2200 on the package substrate 2100, bonding layers 2300 placed on lower surfaces of each of the semiconductor chips 2200, a connecting structure 2400 for electrically connecting the semiconductor chips 2200 and the package substrate 2100, and a molding layer 2500 that covers the semiconductor chips 2200 and the connecting structure 2400 on the package substrate 2100.

The package substrate 2100 may be a printed circuit board that includes package upper pads 2130. The package substrate 2100 may include a package substrate body 2120, package upper pads 2130 placed on an upper surface of the package substrate body 2120, lower pads 2125 placed on a lower surface of the package substrate body 2120 or exposed through the lower surface, and internal wirings 2135 that electrically connect the upper pads 2130 and the lower pads 2125 inside the package substrate body 2120. The upper pads 2130 may be electrically connected to the connecting structures 2400. The lower pads 2125 may be connected to the wiring patterns 2005 of the main board 2001 of the semiconductor memory system 2000 through conductive connections 2800.

Each semiconductor chip 2200 may include an I/O pad 2210. The I/O pad 2210 may correspond to the I/O pad 1101 of FIG. 23. Each of the semiconductor chips 2200 may include word lines 3210 and channel structures 3220. Each of the semiconductor chips 2200 may include the above-mentioned semiconductor device.

In exemplary embodiments, the connecting structure 2400 may be a bonding wire that electrically connects the I/O pad 2210 and the package upper pad 2130. Therefore, in each of the first and second semiconductor memory packages 2003a and 2003b, the semiconductor chips 2200 may be electrically connected to each other by a bonding wire method, and may be electrically connected to the package upper pad 2130 of the package substrate 2100. According to another embodiment, in each of the first and second non-volatile memory packages 2003a and 2003b, the semiconductor chips 2200 may be electrically connected to each other by a connecting structure including a through electrode (Through Silicon Via, TSV), instead of the bonding wire type connecting structure 2400.

In the exemplary embodiments, the controller 2002 and the semiconductor chips 2200 may be included in a single package. In the exemplary embodiments, the controller 2002 and the semiconductor chips 2200 may be mounted on an interposer substrate different from the main board 2001, and the controller 2002 and the semiconductor chips 2200 may be connected to each other by wiring formed on the interposer substrate.

Referring to FIG. 25, each of the semiconductor chips 2200 may include a semiconductor substrate 3010, and a first structure 3100 and a second structure 3200 that are sequentially stacked on the semiconductor substrate 3010. The first structure 3100 may include a peripheral circuit region including peripheral wirings 3110. The second structure 3200 may include a common source line 3205, a gate stacked structure 3210 on the common source line 3205, memory channel structures 3220 and separation structures 3230 penetrating the gate stacked structure 3210, bit lines 3240 electrically connected to the memory channel structures 3220, and gate connection wirings 1115 electrically connected to the word wires WL of the gate stacked structure 3210.

The semiconductor device shown in FIG. 25 includes a second substrate 100 which is placed on the peripheral circuit region PA and on which a cell array region CA is formed, a mold structure ST including an inter-electrode insulating layer 140 and gate electrode layers GSL and WL0 to WLn stacked on the second substrate 100, a plurality of channel structures CH that penetrate the mold structure ST and are separated from each other in one direction parallel to the upper surface of the second substrate 100, a separation structure WLC that is placed between plurality of channel structures CH and separates the gate electrode layers GSL and WL0 to WLn in one direction, and an auxiliary channel structure DCH which penetrates a part of the mold structure ST and is placed between the separation structure WLC and each channel structure CH.

The semiconductor device shown in FIG. 25 includes first and second cell array regions CA_1 and CA_2 separated from each other in one direction, a second substrate 100 which has a separation region A2 placed between the first and second cell array regions CA_1 and CA_2 in one direction, a mold structure ST including an insulating layer 140 and gate electrode layers GSL and WL1 to WLn alternately stacked on the second substrate 100, a plurality of channel structures CH which penetrate the mold structure ST and separated from each other in the other direction intersecting with one direction in each of the first and second cell array regions CA_1 and CA_2, a separation structure WLC which is placed at the same position of the plurality of channel structures on the basis of the other direction in the separation region A2 and spaced apart from each other in the other direction, and an auxiliary channel structure DCH which is spaced apart from each other in the other direction between the first and second cell array regions CA_1 and CA_2 and the separation region A2. However, the auxiliary channel structure DCH penetrates the upper part of the mold structure ST but does not come into contact with the bottom surface of the mold structure ST.

In concluding the detailed description, those skilled in the art will appreciate that many variations and modifications may be made to the preferred embodiments without substantially departing from the principles of the present disclosure. Therefore, the disclosed preferred embodiments of the invention are used in a generic and descriptive sense only and not for purposes of limitation.

What is claimed is:

1. A semiconductor device comprising:

a substrate extending in a first direction and a second direction perpendicular to the first direction, the substrate disposed on a peripheral circuit region and having a cell array region formed therein;

a first mold structure which includes insulating layers and gate electrodes alternately stacked on the substrate;

first and second channel structures penetrating, in a third direction perpendicular to the first direction and the second direction, the first mold structure and spaced apart from each other in the first direction;

a separation structure penetrating the first mold structure in the third direction between the first and second channel structures and separating the gate electrodes in the first direction, the separation structure formed of an insulating material; and first and second auxiliary channel structures between the separation structure and the first channel structure, and between the separation structure and the second channel structure, respectively, wherein the first and second auxiliary channel structures contact a set of the gate electrodes.

2. The semiconductor device of claim 1, further comprising:

a common source plate disposed on the substrate below the gate electrodes and in contact with the first and second channel structures, wherein the first and second auxiliary channel structures penetrate an upper part of the first mold structure and are not in contact with the common source plate.

3. The semiconductor device of claim 1, wherein heights of lower ends of the first and second auxiliary channel structures are higher than heights of lower ends of the first and second channel structures.

4. The semiconductor device of claim 1, further comprising:

a second mold structure which includes insulating layers and gate electrodes alternately stacked on the first mold structure, wherein the first and second auxiliary channel structures penetrate the second mold structure.

5. The semiconductor device of claim 1, wherein the first and second channel structures are disposed in first and second channel holes each include a blocking film, a charge storage film, a tunnel insulating film, and a semiconductor pattern formed along profiles of first and second channel holes penetrating the first mold structure, the first and second auxiliary channel structures each include an oxide layer formed along profiles of first and second auxiliary channel holes which penetrate a part of the first mold structure, and diameters of the first and second auxiliary channel holes are smaller than diameters of the first and second channel holes.

6. The semiconductor device of claim 1, wherein:

the first channel structure includes first and second channel patterns which are spaced apart from each other in the second direction, the second channel structure includes third and fourth channel patterns spaced apart from each other in the second direction, the separation structure includes first and second separation patterns spaced apart from each other in the second direction between the first and second channel structures, and the first and second auxiliary channel structures include a first auxiliary channel pattern disposed between the first channel pattern and the first separation pattern in the first direction, and a second auxiliary channel pattern that is spaced apart from the first auxiliary channel pattern in the second direction and disposed between the second channel pattern and the second separation pattern in the first direction.

7. The semiconductor device of claim 6, wherein the first and second separation patterns are merged with each other to form a bar-shaped first extension pattern that extends in the second direction, and a first protrusion pattern that protrudes from the first extension pattern in the first direction.

8. The semiconductor device of claim 7, wherein the first and second auxiliary channel patterns and the first and second separation patterns are merged with each other to form a second protrusion pattern that protrudes in the first direction.

9. The semiconductor device of claim 6, wherein each of a first distance between the first auxiliary channel pattern and the second auxiliary channel pattern, a second distance between the first auxiliary channel pattern and the first channel pattern, and a third distance between the first auxiliary channel pattern and the first separation pattern is 0.5 times or more and 1.5 times or less than a distance between the first channel pattern and the second channel pattern.

10. The semiconductor device of claim 6, wherein each of a first distance between the first auxiliary channel pattern and the second auxiliary channel pattern, a second distance between the first auxiliary channel pattern and the first channel pattern, and a third distance between the first auxiliary channel pattern and the first separation pattern is 0.5 times or more and 1.5 times or less than a distance between the first separation pattern and the second separation pattern.

11. The semiconductor device of claim 6, wherein the first channel pattern and the first separation pattern overlap each other in the first direction, and the second channel pattern and the second separation pattern overlap each other in the first direction, a center of the first auxiliary channel pattern does not overlap a center of the first channel pattern and a center of the second channel pattern in the first direction, and the center of the first auxiliary channel pattern does not overlap a center of the first separation pattern and a center of the second separation pattern in the first direction.

12. A semiconductor device comprising:

a substrate, extending in a first direction and a second direction perpendicular to the first direction, on which a plurality of cell regions, a separation region between two adjacent cell regions of the plurality of cell regions, and a dummy region between one of the plurality of cell regions and the separation region are formed;

a mold structure which includes insulating layers and gate electrodes alternately stacked on the substrate;

first and second channel structures penetrating, in a third direction perpendicular to the first direction and the second direction, the mold structure and spaced apart from each other in the first direction, in each of the plurality of cell regions;

a separation structure penetrating the mold structure in the third direction between the first and second channel structures, in the separation region; and first and second auxiliary channel structures which are spaced apart from each other in the second direction, in the dummy region, wherein:

the separation structure contacts a set of the gate electrodes, the first and second channel structures each include a blocking film, a charge storage film, a tunnel insulating film, and a semiconductor pattern which are formed along profiles of first and second channel holes penetrating the mold structure, the first and second auxiliary channel structures each include an oxide layer formed along profiles of first and second auxiliary channel holes that penetrate a part of the mold structure, and at a first height above a surface of the substrate, maximum diameters of the first and second auxiliary channel holes are smaller than maximum diameters of the first and second channel holes.

13. The semiconductor device of claim 12, wherein the separation structure overlaps the first channel structure in the first direction.

14. The semiconductor device of claim 12, wherein the first and second auxiliary channel structures penetrate an upper part of the mold structure and do not come into contact with a bottom surface of the mold structure.

15. The semiconductor device of claim 12, wherein the first and second channel structures each have a circular cross-sectional shape as viewed from a plan view, and the first and second auxiliary channel structures each have a circular cross-sectional shape as viewed from a plan view.

16. The semiconductor device of claim 12, wherein the first and second auxiliary channel structures and the separation structure are merged with each other to form first and second protrusion patterns protruding in the first direction, and a first length of the first protrusion pattern protruding in the first direction is different from a second length of the second protrusion pattern protruding in the first direction.

17. An electronic system comprising:

a main board;

a semiconductor device on the main board; and a controller electrically connected to the semiconductor device on the main board, wherein the semiconductor device includes a substrate, extending in a first direction and a second direction perpendicular to the first direction, on which a plurality of cell regions spaced apart from each other in the first direction, a separation region disposed between two adjacent cell regions of the plurality of cell regions in the first direction, and a dummy region disposed between one of the plurality of cell regions and the separation region in the first direction are formed;

a first mold structure which includes insulating layers and gate electrodes alternately stacked on the substrate;

first and second channel structures that penetrate, in a third direction perpendicular to the first direction and the second direction, the first mold structure and are spaced apart from each other in the second direction, in each of the plurality of cell regions;

first and second separation structures disposed in the separation region, the first and second separation structures spaced apart from each other in the second direction; and first and second auxiliary channel structures which are spaced apart from each other in the second direction in the dummy region, wherein the first and second auxiliary channel structures penetrate an upper part of the first mold structure, and do not come into contact with a bottom surface of the first mold structure, and wherein the first and second auxiliary channel structures contact a set of the gate electrodes.

18. The electronic system of claim 17, wherein each of the first channel structure and the first separation structure does not overlap centers of the first and second auxiliary channel structures in the second direction.

19. The electronic system of claim 17, wherein the first and second auxiliary channel structures and the first and second separation structures are merged with each other to form first and second protrusion patterns protruding in the first direction, and a first length of the first protrusion pattern protruding in the first direction is different from a second length of the second protrusion pattern protruding in first direction.

20. The electronic system of claim 17, further comprising:

a second mold structure which includes insulating layers and gate electrodes alternately stacked on the first mold structure, wherein the first and second auxiliary channel structures penetrate the second mold structure.

* * * * *